United States Patent
Kaneko

(10) Patent No.: US 11,482,945 B2
(45) Date of Patent: Oct. 25, 2022

(54) RECTIFYING CIRCUIT TO REDUCE DC OFFSET CURRENT

(71) Applicant: Asahi Kasei Microdevices Corporation, Tokyo (JP)

(72) Inventor: Tohru Kaneko, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 168 days.

(21) Appl. No.: 17/030,271

(22) Filed: Sep. 23, 2020

(65) Prior Publication Data
US 2021/0104952 A1    Apr. 8, 2021

(30) Foreign Application Priority Data
Oct. 3, 2019 (JP) .............................. JP2019-183210

(51) Int. Cl.
*H02M 7/217* (2006.01)
*H03F 3/45* (2006.01)

(52) U.S. Cl.
CPC ........ *H02M 7/217* (2013.01); *H03F 3/45179* (2013.01); *H03F 3/45183* (2013.01)

(58) Field of Classification Search
CPC ........... H02M 7/12; H02M 7/21; H02M 7/217
See application file for complete search history.

(56) References Cited

U.S. PATENT DOCUMENTS

| | | | | |
|---|---|---|---|---|
| 3,571,662 A | * | 3/1971 | Paine ................... | H02H 7/1213 363/55 |
| 4,283,667 A | * | 8/1981 | Dinger ................. | H02M 7/1557 318/532 |
| 4,409,500 A | * | 10/1983 | Welland ................ | H03D 1/18 327/531 |
| 5,731,695 A | * | 3/1998 | Shioda .................. | H03G 7/08 455/72 |
| 6,430,071 B1 | * | 8/2002 | Haneda ................. | H03K 17/302 363/127 |

(Continued)

FOREIGN PATENT DOCUMENTS

| | | |
|---|---|---|
| JP | H0360885 U | 6/1991 |
| JP | H059193 U | 2/1993 |

(Continued)

OTHER PUBLICATIONS

Minhao Yang et al. "Design of an Always-On Deep Neural Network-Based 1-µW Voice Activity Detector Aided With a Customized Software Model for Analog Feature Extraction." IEEE Journal of Solid-state Circuits, vol. 54, No. 6, Jun. 2019, p. 1764-p. 1777.

*Primary Examiner* — Gustavo A Rosario-Benitez

(57) ABSTRACT

A rectifying circuit includes: a voltage-current converting circuit that converts an input voltage into a current; a first transistor and a second transistor that are connected in series and that are connected to a first node into which the current converted by the voltage-current converting circuit flows; a third transistor and a fourth transistor that are connected in series, and that respectively mirror a current flowing through the first transistor and a current flowing through the second transistor; and a first diode that is connected between a second node connected to the third transistor and the fourth transistor, and an output terminal.

8 Claims, 27 Drawing Sheets

(56) References Cited

U.S. PATENT DOCUMENTS

| | | | | |
|---|---|---|---|---|
| 2006/0232257 A1* | 10/2006 | Kadanka | ................ | G05F 3/265 |
| | | | | 323/316 |
| 2009/0295434 A1* | 12/2009 | Umeda | .................. | H03F 3/082 |
| | | | | 327/103 |
| 2012/0081936 A1* | 4/2012 | Walters | ................ | H02M 7/217 |
| | | | | 363/80 |

FOREIGN PATENT DOCUMENTS

| | | | |
|---|---|---|---|
| JP | 3105590 | B2 | 11/2000 |
| JP | 2000357923 | A | 12/2000 |

\* cited by examiner

RECTIFYING CIRCUIT TO REDUCE DC OFFSET CURRENT

The contents of the following Japanese patent application are incorporated herein by reference: NO. 2019-183210 filed in JP on Oct. 3, 2019

BACKGROUND

1. Technical Field

The present invention relates to a rectifying circuit.

2. Related Art

In the related art, a full-wave rectifying circuit using a differential amplifier such as an operational amplifier and a Gm cell has been known (for example, refer to Patent Literature 1 and Patent Literature 2).
[Patent Literature 1] Japanese Unexamined Patent Application Publication No. 2000-357923
[Patent Literature 2] Japanese Patent No. 3105590

DESCRIPTION OF EXEMPLARY EMBODIMENTS

Hereinafter, the present invention will be described through embodiments of the invention, but the following embodiments do not limit the invention according to the claims. Further, not all the combinations of features described in the embodiments are essential for means to solve the problem in the invention.

Figure 1:
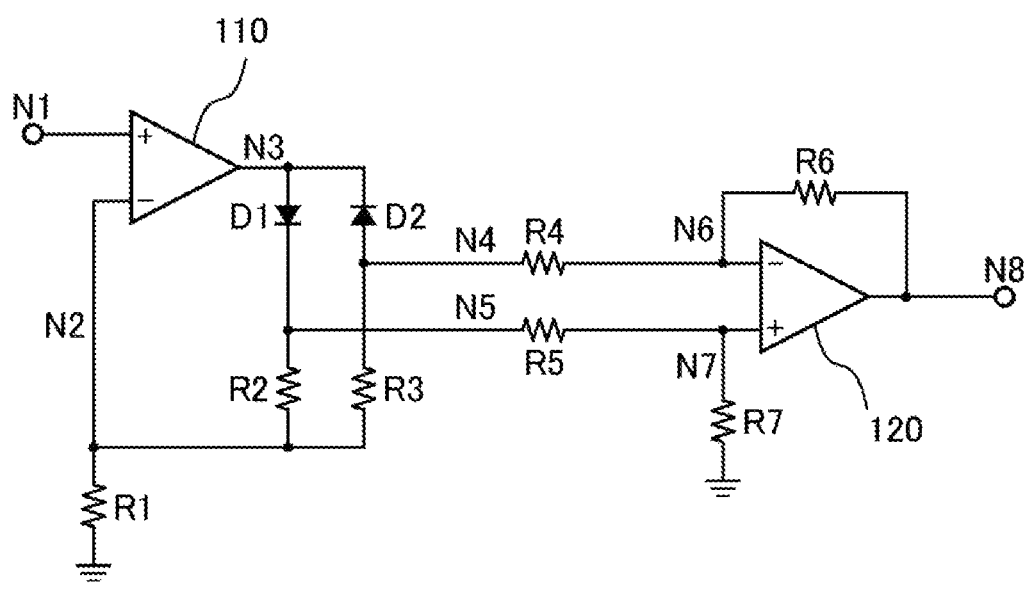
FIG. 1 is a circuit diagram showing a configuration example of a rectifying circuit 100 according to the present embodiment.

FIG. 1 is a circuit diagram showing a configuration example of a rectifying circuit 100 according to the present embodiment. The rectifying circuit 100 has operational amplifiers 110 and 120. The operational amplifiers 110 and 120 are examples of a differential amplifier. N1 to N8 indicate nodes in the rectifying circuit 100.

The operational amplifier 110 has a first input terminal to which an input signal voltage applied to N1 is input, a second input terminal connected to a reference voltage terminal via N2, and an output terminal for outputting an output voltage to N3. A resistor R1 is provided between N2 and the reference voltage terminal, and diodes D1 and D2 for rectification are provided in an anti-parallel manner between N2 and N3. As an example, the diode D1 is connected to N2 on a cathode side via a resistor R2, and the diode D2 is connected to N2 on an anode side via a resistor R3.

The operational amplifier 120 has a first input terminal to which an input signal voltage applied to N6 is input, a second input terminal connected to a reference voltage terminal via N7, and an output terminal for outputting an output voltage to N8. A resistor R7 is provided between N7 and the reference voltage terminal. N6 is connected, via a resistor R4, to N4 between the diode D2 and the resistor R3. N7 is connected, via a resistor R5, to N5 between the diode D1 and the resistor R2. The output terminal of the operational amplifier 120, and N6 are connected via a resistor R6.

First, assuming a situation in which the diodes are not electrically conductive, the operational amplifier 110 is in an open-loop state, and thus the operational amplifier 110 amplifies, by its own gain, the input signal voltage applied to N1 so as to output the amplified input signal voltage to N3. When a varying voltage of N3 exceeds a threshold voltage of the diode D1 or the diode D2, a negative feedback circuit of N3-N5-N2 or N2-N4-N3 becomes electrically conductive, and if the voltage of N1 is positive, a signal voltage is generated at N5, and if the voltage of N1 is negative, the signal voltage is generated at N4. The operational amplifier 120 constitutes a negative feedback amplifying circuit, inverts a voltage on an N4 side, and adds up a voltage on an N5 side so as to output a full-wave rectified waveform to N8.

Figure 2:
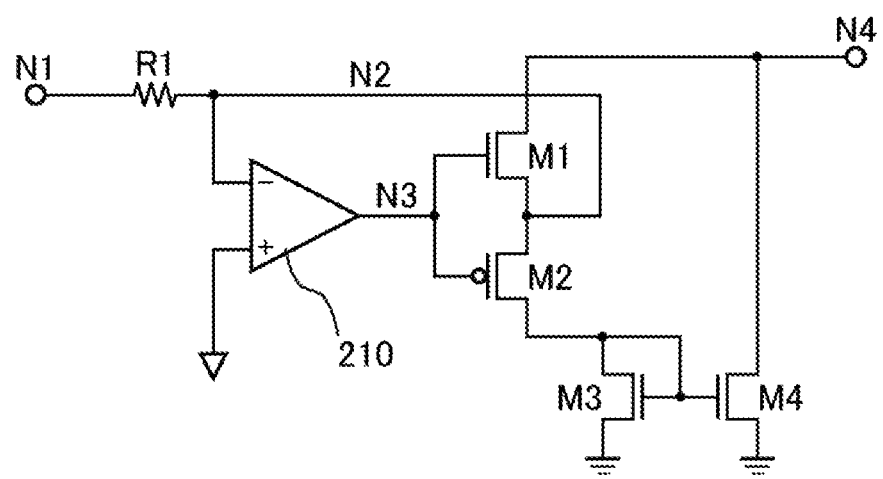
FIG. 2 is a circuit diagram showing a configuration example of a rectifying circuit 200 according to the present embodiment.

FIG. 2 is a circuit diagram showing a configuration example of a rectifying circuit 200 according to the present embodiment. Similarly to the rectifying circuit 100, the rectifying circuit 200 is a full-wave rectifying circuit using an operational amplifier. The rectifying circuit 200 has an operational amplifier 210, transistors M1 and M2, and transistors M3 and M4.

The operational amplifier 210 has a first input terminal to which an input signal voltage applied to N1 is input via R1, a second input terminal connected to a reference voltage terminal, and an output terminal for outputting an output voltage to N3. A resistor R1 is provided between N1 and the first input terminal.

As an example, the transistor M1 and the transistor M2 are an NMOS transistor and a PMOS transistor, respectively. The voltage output to N3 is input to the transistors M1 and M2. Outputs of the transistors M1 and M2 are input to N2 between the resistor R1 and a first output terminal. A drain side of the transistor M2 is connected to the transistor M3, and a current flowing through the transistor M3 is mirrored by the transistor M4. A drain side of the transistor M1 has a common connection with the transistor M4 in outputting, and the outputs are output to N4.

Initially, when the signal voltage of the input terminal N1 is 0, both of the transistor M1 and the transistor M2 are present in a weak inversion region, and negative feedback which is feedback via N3 and N2 is not established. When the signal voltage is input to the input, the voltage of N3 changes such that any of the transistor M1 or the transistor M2 enters a saturation region, and the negative feedback is completed. When the negative feedback is completed, the voltage of N2 is fixed to a constant voltage by a virtual short circuit, and the signal voltage is converted into a signal current by the resistor R1. This current flows into a transistor of either the transistor M1 or the transistor M2, the transistor being in the saturation region, and reaches an output of N4 (through a current inverting circuit of the transistors M3 and M4 when the current flows into the transistor M2). Accordingly, the transistors M1 and M2 behave as if they were rectifying elements, and thus work similarly to the diodes D1 and D2 in FIG. 1.

In this way, by providing the diode for rectification or the MOS in the weak inversion region in the negative feedback circuit of the operational amplifier, the full-wave rectifying circuit is achieved. Note that the operational amplifier typically has a low gain at a high frequency, and thus it is required to increase current consumption of the operational amplifier in order to obtain, by amplifying a high frequency signal, an output voltage exceeding a threshold voltage of a diode (in the case of FIG. 2, a VGS voltage for the transistors M1 and M2 to transition from the weak inversion region to the saturation region).

Figure 3A:
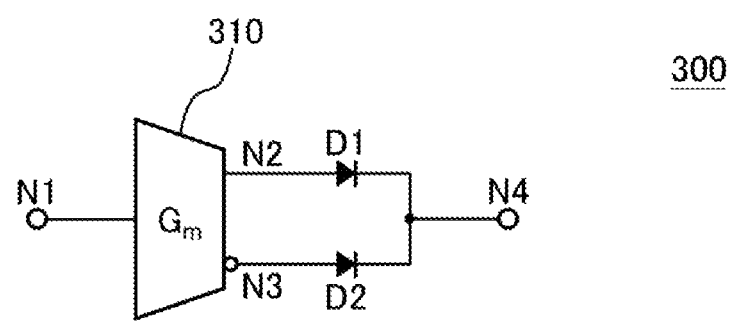
FIG. 3A is a conceptual diagram of a rectifying circuit 300 according to the present embodiment.

FIG. 3A is a conceptual diagram of a rectifying circuit 300 according to the present embodiment. As shown in FIG. 3A, the rectifying circuit 300 has a Gm cell 310, and diodes D1 and D2. The Gm cell is an example of a differential amplifier. The rectifying circuit 300 is different from the example of FIG. 1 and FIG. 2 in which the negative feedback of the operational amplifier is performed, and a voltage-current converting circuit of differential output is directly connected to the diode.

Figure 3B:
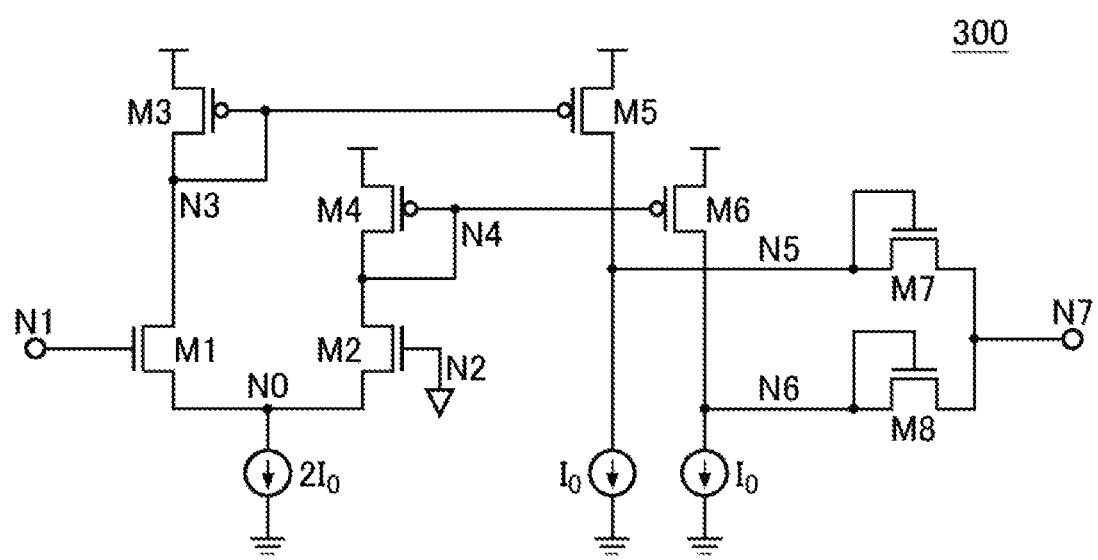
FIG. 3B is a circuit diagram showing a configuration example of the rectifying circuit 300 according to the present embodiment.

FIG. 3B is a circuit diagram showing a configuration example of the rectifying circuit 300 according to the present embodiment. From FIG. 3B, it is understood that the Gm cell 310 serves as an open-loop voltage-current converting element for a class A operation. The voltage input to N1 is converted into a signal current by an input differential pair of transistors M1 and M2, and this signal current is duplicated on gate node sides of transistors M7 and M8 via current mirrors of transistors M3 and M5, and transistors M4 and M6. Each of the transistors M7 and M8 serves as a rectifying diode, and a gate node side is an anode, and a source node side is a cathode. That is, each of the transistors M7 and M8 causes the signal current to flow only from a gate side to a source side. Since the signal currents output from the transistors M5 and M6 are differential signals, only a signal current consistent with a rectification direction of the transistor M7 or the transistor M8 reaches N7 to achieve a full-wave rectifying operation.

In FIG. 3B, bias currents of the transistors M1 to M6 are all $I_0$, and the total current consumption is $4I_0$. On the other hand, a maximum value of the signal current that the rectifying circuit 300 can output is $I_0$. This is because the voltage-current converting circuit from the transistor M1 to the transistor M6 is wholly operating in a class A region and thus it is impossible to supply a signal current larger than or equal to the bias current. Accordingly, it is required to make the bias current large in order to increase the maximum value of the signal current of the rectifying circuit.

Figure 4:
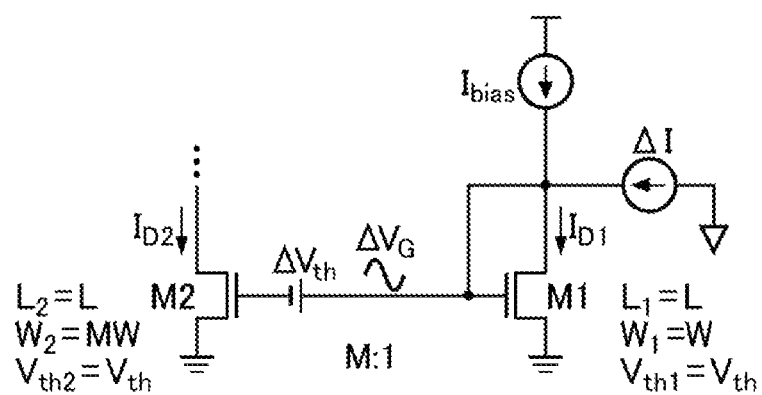
FIG. 4 is a circuit diagram showing a configuration example of a current mirror circuit assuming a threshold error.

FIG. 4 is a circuit diagram showing a configuration example of a current mirror circuit assuming a threshold error. It is known that a DC offset output current, which is caused due to a transistor mismatch in an output unit of the rectifying circuit (the output node N7 of the rectifying circuit 300 in FIG. 3B), is proportional to $I_0$. Assuming a threshold error $\Delta V_{th}$ between the transistor M1 and the transistor M2 that make a pair and constitute the current mirror circuit as shown in FIG. 4, when a current ratio M=1 and $\Delta I=0$, the following relationship is established between a drain current $I_{D2}$ flowing through the transistor M2, and a bias current $I_{bias}$.

$$I_{D2} = I_{bias}\left(1 - \frac{\Delta V_{th}}{V_{eff}}\right)^2 \approx I_{bias} - 2I_{bias}\frac{\Delta V_{th}}{V_{eff}}$$

Here, $V_{eff}$ is an effective gate voltage, and using a gate width W, a gate length L, a mobility $\mu$, and an oxide film capacitance density $C_{ox}$, the following relationship is established.

$$I_{bias} = \frac{1}{2}\mu C_{ox}\frac{W}{L}V_{eff}^2$$

As a result, an offset current $I_{offset}$ expressed by the following equation is generated between the transistor M1 and the transistor M2 in FIG. 4.

$$I_{offset} = I_{D1} - I_{D2} \approx 2I_{bias}\frac{\Delta V_{th}}{V_{eff}}$$

Referring again to FIG. 3B, since an offset current is generated by the current mirrors of, for example, the transistors M3 and M5, and the transistors M4 and M6 and the bias current is $I_0$ which is sufficiently larger than the maximum signal current handled by the rectifying circuit, the offset current has a very large value. This offset current penetrates through the diode, reaches N7, and is handled as an output DC offset of the rectifying circuit. Therefore, the signal current which can be actually handled by this circuit is limited to a range from $I_{offset}$ (proportional to $I_0 \Delta V_{th}/V_{eff}$) to That is, as shown in FIG. 3B, in a configuration in which a typical voltage-current converting element that does not use negative feedback is connected to a rectifying diode, large current consumption is required to obtain a large output amplitude while a large offset current is generated.

Figure 5:
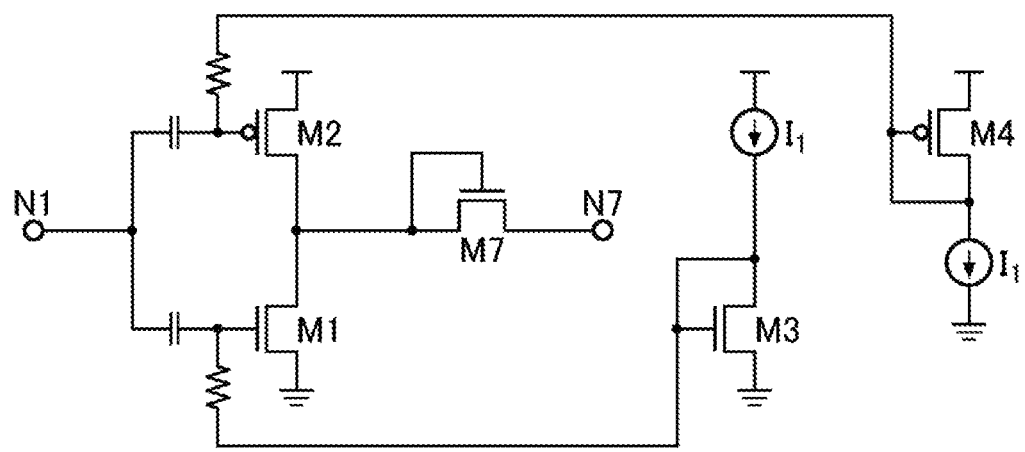
FIG. 5 is a circuit diagram showing a configuration example of a rectifying circuit 500 according to the present embodiment.

FIG. 5 is a circuit diagram showing a configuration example of a rectifying circuit 500 according to the present embodiment. Here, only half-wave rectification is shown for simplicity. The rectifying circuit 500 has transistors M1, M2, M3, M4, and M7. The transistors M3 and M4 constitute replica circuits and play roles of creating a bias voltage required for a minute bias current $I_1$ to flow. The signal currents output from the transistors M1 and M2 are input to a gate node side of the transistor M7. The transistor M7 is a rectifying diode, and the gate node side is an anode, and a source node side is a cathode. That is, the transistor M7 causes the signal current to flow only from the gate side to the source side. Only the signal current consistent with a rectification direction of the transistor M7 reaches N7 to achieve a rectifying operation.

Capacitors connected to gates of the transistors M1 and M2 are DC cut capacitors, and gate DC voltages of the transistors M1 and M2 are supplied from the transistors M3 and M4 via resistors. Therefore, in terms of DC, the transistors M1 and M3, and the transistors M2 and M4 serve as the current mirrors, respectively, and when an input signal voltage applied to N1 is 0, a bias current $I_1$ flows through the transistors M1 and M2. In this case, a DC offset current that reaches the output N7 is the sum of offset currents $I_{offset}$ of respective current mirrors, and thus the DC offset current can be expected to be significantly reduced by setting the bias current $I_1$ to be small.

On the other hand, a maximum output current is ideally infinite, and is not limited to the bias current $I_1$. Accordingly, by designing the bias current $I_1$ to be restricted, it is possible to handle a large output signal while maintaining low current consumption and low offset.

However, a voltage-current conversion coefficient in the rectifying circuit 500 is achieved by a transconductance $g_m$ of the transistors M1 and M2. The following relationship is established between $g_m$ and a drain current $I_D$.

$$g_m = \frac{\partial I_D}{\partial V_{GS}} = \frac{2 I_D}{V_{eff}} = \sqrt{2 \mu C_{ox} \frac{W}{L} I_D}$$

Here, it should be noted that the drain current $I_D$ includes, for example in the transistor M1, not only the bias current $I_1$ but also the signal current generated by the transistor M1. When the bias current $I_1$ is made to be small to reduce the offset, a ratio of the signal current to the drain current $I_D$ increases, and thus $g_m$ varies depending on a magnitude of the input signal.

$$g_m \propto \sqrt{I_D}$$

In the above expressed relationship, the larger the input signal voltage is, the larger the voltage-current conversion coefficient is, and linearity of the input/output characteristics is reduced.

Note that in order to suppress a variation of $g_m$, for example, source degeneration is used. However, $g_m$ which is large to a certain extent is required in order to sufficiently suppress the variation of $g_m$, and thus an application to the rectifying circuit that is designed to restrict the bias current $I_1$ is difficult.

When the input signal voltage is very small, the following relationship is established.

$$I_D \approx I_1$$

Therefore, the following relationship is established.

$$g_m \approx \sqrt{2 \mu C_{ox} \frac{W}{L} I_1}$$

Here, the bias current $I_1$ is set to be small for an offset reduction design, and this $g_m$ value is also small. That is, when the bias current $I_1$ is made to be small for the offset reduction, the signal current obtained by the voltage-current conversion is made to be small at the same time. Accordingly, in this configuration, there is a trade-off relationship between reducing the offset current and securing the signal current when the amplitude is small.

That is, in the circuit configuration of FIG. 5, the large current consumption is required to obtain a stable rectifying circuit output, and as a result, the offset current also increases. Similarly to FIG. 3B, in a configuration in which the typical voltage-current converting element that does not use negative feedback is connected to the rectifying diode, it is difficult to achieve the low current consumption and the low output DC offset.

Figure 6:
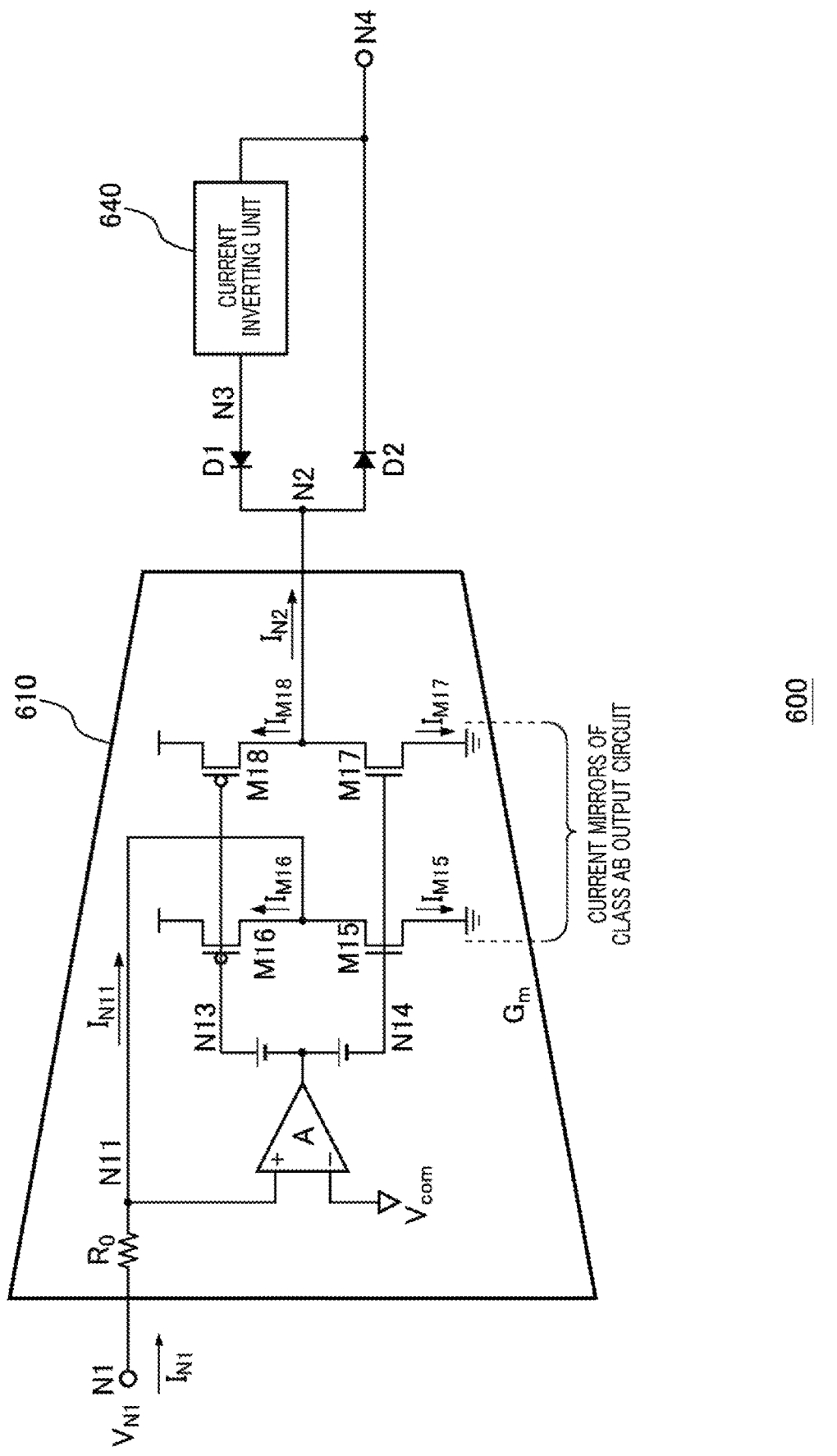
FIG. 6 is a conceptual diagram of a rectifying circuit 600 according to the present embodiment.

FIG. 6 is a conceptual diagram of a rectifying circuit 600 according to the present embodiment. The rectifying circuit 600 has a voltage-current converting unit 610, a current inverting unit 640, and diodes D1 and D2. The voltage-current converting unit 610 and the current inverting unit 640 are virtual functional blocks. Note that elements unnecessary for describing the concept of the rectifying circuit 600 are omitted in FIG. 6 for convenience.

The voltage-current converting unit 610 has an operational amplifier A, converts a signal voltage applied to N1 into a current, and outputs a signal current $I_{N2}$ to N2. N1 is an input node to the voltage-current converting unit 610, and N2 is a node between the voltage-current converting unit 610, and the diodes D1 and D2.

The diodes D1 and D2 are rectifying diodes provided between N2 and N4. For example, the diode D1 has a cathode side connected to N2, and causes a current to flow only from N3 to a direction of N2. On the other hand, the diode D2 has an anode side connected to N2, and causes a current to flow only from N2 to a direction of N4. N3 is a node between the diode D1 and the current inverting unit 640, and N4 is an output node of the rectifying circuit 600. The current inverting unit 640 outputs a signal current which has the same amplitude as a current flowing through an N3 side, and has a phase 180 degrees different from the current flowing through the N3 side (a direction of the current is inverted). The signal current from the current inverting unit 640 and the signal current from D2 are combined to be output to N4.

Figure 7:
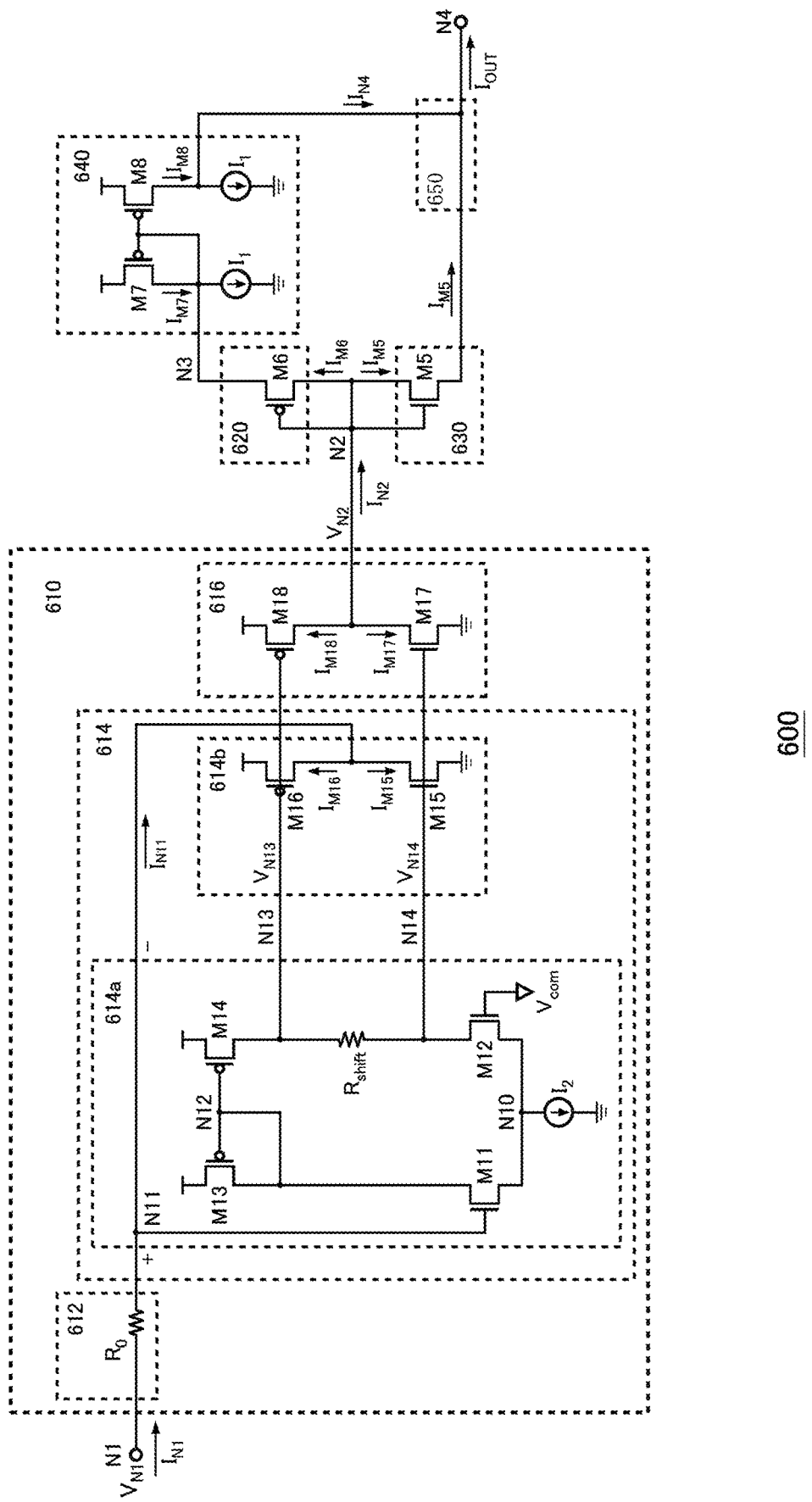
FIG. 7 is a circuit diagram showing a configuration example of the rectifying circuit 600 shown in FIG. 6.

FIG. 7 is a circuit diagram showing a configuration example of the rectifying circuit 600 shown in FIG. 6. The rectifying circuit 600 has functional blocks such as current half-wave rectifying units 620 and 630, and a current adding unit 650 in addition to the functional blocks described with reference to FIG. 6.

The voltage-current converting unit 610 has a voltage-current converting element 612, a current recovering circuit 614, and a current regenerating circuit 616. The voltage-current converting element 612 converts a voltage signal $V_{N1}$, which is input to one end, into a current signal $I_{N1}$. Here, the voltage $V_{N1}$ is an input signal voltage applied to N1, the current $I_{N1}$ is a signal current which has an amplitude proportional to an amplitude of the voltage $V_{N1}$, and has the same frequency as the voltage $V_{N1}$. As an example, the voltage-current converting element 612 is a resistor $R_0$.

The current recovering circuit 614 has an amplifier 614a and a current regenerating circuit 614b. The amplifier 614a constitutes a voltage-current converting circuit together with the voltage-current converting element 612. In the amplifier 614a, a gate terminal of a transistor M11 is connected to the other end of the voltage-current converting element 612 and N11, and a gate terminal of a transistor M12 is connected to a reference potential $V_{com}$. N11 is a node which is between the other end of the voltage-current converting element 612, and transistors M15 and M16 described later, and into which the current $I_{N1}$ converted by the voltage-current converting element 612 flows. As an example, the amplifier 614a has an operational amplifier A which is a source-grounded single-ended operational amplifier. The amplifier 614a has transistors M11, M12, M13, and M14, and a resistor $R_{shift}$. As an example, the transistors M11 and M12 are NMOS transistors, and the transistors M13 and M14 are PMOS transistors. The resistor $R_{shift}$ is a level shift circuit for adjusting a bias point of each transistor.

The current regenerating circuit 614b has transistors M15 and M16 connected in series. The transistors M15 and M16 are connected to N11. As an example, the transistor M15 is an NMOS transistor and the transistor M16 is a PMOS transistor. The transistors M15 and M16 constitute a class AB output circuit, and constitute a two-stage operational amplifier together with the operational amplifier A.

The amplifier 614a outputs bias voltages $V_{N13}$, $V_{N14}$ to the transistors M15 and M16, respectively. In other words, the amplifier 614a outputs the voltages $V_{N13}$, $V_{N14}$ required for the current regenerating circuit 614b to regenerate a current $I_{N11}$ which flows through N11. The amplifier 614a compares the current $I_{N1}$ to the current $I_{N11}$, and amplifies a difference component to create the voltages $V_{N13}$, $V_{N14}$. The current regenerating circuit 614b creates the current $I_{N11}$ from the voltages $V_{N13}$, $V_{N14}$.

These blocks constitute negative feedback, and convergence is made when $I_{N1}=I_{N11}$ (when the amplifier 614a has no gain, $I_{N1} \neq I_{N11}$). That is, the amplifier 614a uses the gain of the amplifier to match $I_{N11}$ to $I_{N1}$. As a result, the amplifier 614a creates the voltage signals $V_{N13}$, $V_{N14}$ required for the current regenerating circuit 614b to output the same current $I_{N11}$ as the current $I_{N1}$.

As described above, the voltage-current converting unit 610 uses the resistor $R_0$ and the negative feedback circuit of the operational amplifier A so as to perform the voltage-current conversion. Note that the rectifying diode is not inserted in the negative feedback circuit of the operational amplifier A, and thus the problems, which relate to the high frequency gain and the diode threshold and are pointed out in FIG. 1 and FIG. 2, are avoided.

The current regenerating circuit 616 is a block having common properties and functions with the current regenerating circuit 614b. The current regenerating circuit 616 has transistors M17 and M18 connected in series. The transistors M17 and M18 are connected to N2. As an example, the transistor M17 is an NMOS transistor and the transistor M18 is a PMOS transistor. The transistors M17 and M18 constitute the class AB output circuit similarly to the transistors M15 and M16, and have gate voltages that are gate voltages shared by the transistors M15 and 16, respectively.

The expression that the current regenerating circuit 614b and the current regenerating circuit 616 "have common properties and functions" means that the transistors M15 and M16 (the current regenerating circuit 614b) and the transistors M17 and M18 (the current regenerating circuit 616) serve as the current mirrors, respectively. The current regenerating circuit 616 creates the current $I_{N2}$ from the voltages $V_{N13}$, $V_{N14}$, and outputs the created current to N2. The current $I_{N2}$ is the same signal current as the current $I_{N1}$.

The current half-wave rectifying units 620 and 630 have transistors M6 and M5, respectively. As an example, the transistor M5 is an NMOS transistor and the transistor M6 is a PMOS transistor. The transistors M6 and M5 correspond to the diodes D1 and D2, respectively. The current half-wave rectifying unit 620 takes out only a negative side of the signal current $I_{N2}$ to output a signal current $I_{M6}$, and outputs 0 when the signal current $I_{N2}$ is positive. The current half-wave rectifying unit 630 takes out only a positive side of the signal current $I_{N2}$ to output a signal current $I_{M5}$, and outputs 0 when the signal current $I_{N2}$ is negative.

The current inverting unit 640 has transistors M7 and M8. As an example, any of the transistors M7 and M8 is a PMOS transistor. The transistors M7 and M8 serve as the current mirror. The current inverting unit 640 inverts a sign of the signal current $I_{M6}$ to output a signal current $I_{N4}$. The current adding unit 650 outputs, to N4, a signal current $I_{OUT}$ which is the sum of the signal current $I_{M5}$ and the signal current $I_{N4}$.

Figure 8A:
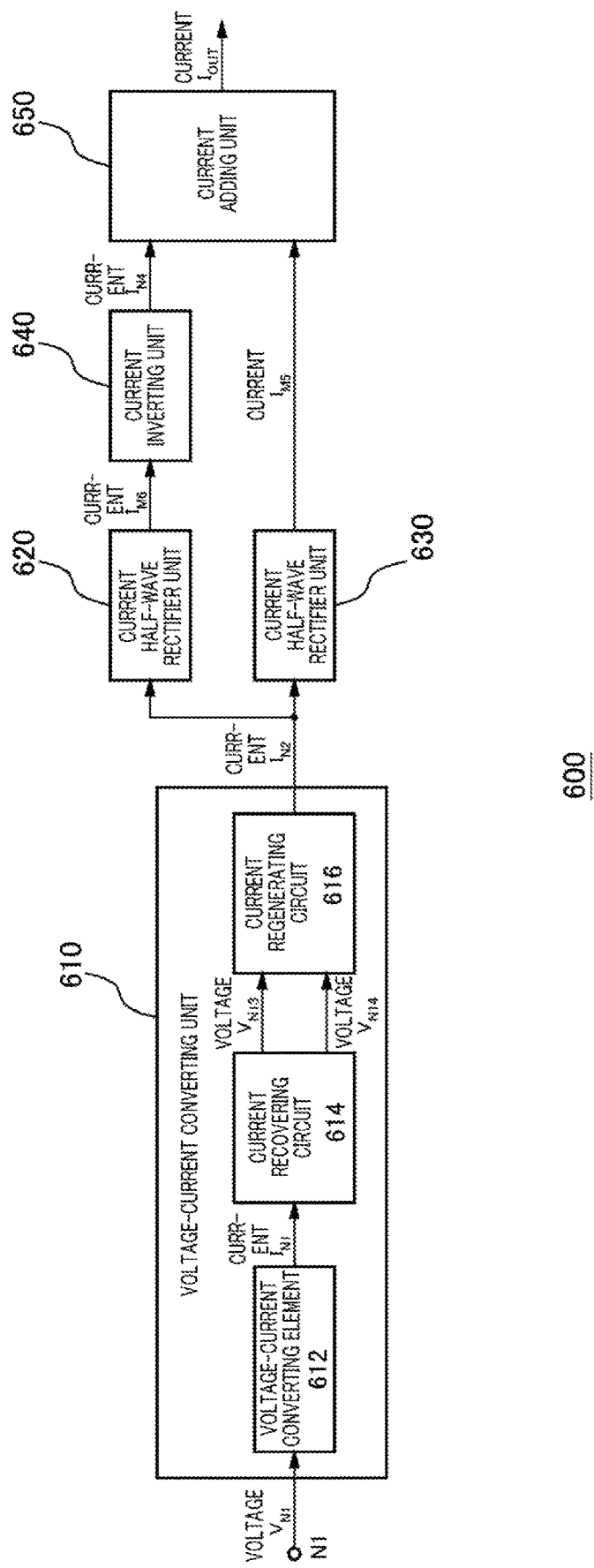
FIG. 8A is a block diagram corresponding to FIG. 7.

FIG. 8A is a block diagram corresponding to FIG. 7. An operation principle of the rectifying circuit 600 will be described with reference to FIG. 8A. The rectifying circuit 600 has the voltage-current converting unit 610, the current half-wave rectifying units 620 and 630, the current inverting unit 640, and the current adding unit 650. In the voltage-current converting unit 610, an input signal voltage $v_{in}$ (corresponding to $V_{N1}-V_{com}$ in FIG. 7) is converted into the current $I_{N1}$ by the voltage-current converting element 612, and the voltage signals $V_{N13}$, $V_{N14}$ are created by the current recovering circuit 614 such that the current $I_{N11}$ is regenerated by the current regenerating circuit 616. The voltage-current converting unit 610 outputs the current $I_{N11}$ as the signal current $I_{N2}$ to the current half-wave rectifying units 620 and 630. The current half-wave rectifying unit 620 outputs the signal current $I_{M6}$ when the signal current $I_{N2}$ is negative, and outputs 0 when the signal current $I_{N2}$ is positive. The current inverting unit 640 inverts the sign of the signal current $I_{M6}$ to output the signal current $I_{N4}$. The current half-wave rectifying unit 630 outputs the signal current $I_{M5}$ when the signal current $I_{N2}$ is positive, and outputs 0 when the signal current $I_{N2}$ is negative. The current adding unit 650 outputs the signal current $I_{OUT}$ which is the sum of the signal current $I_{M5}$ and the signal current $I_{N4}$.

Figure 8B:
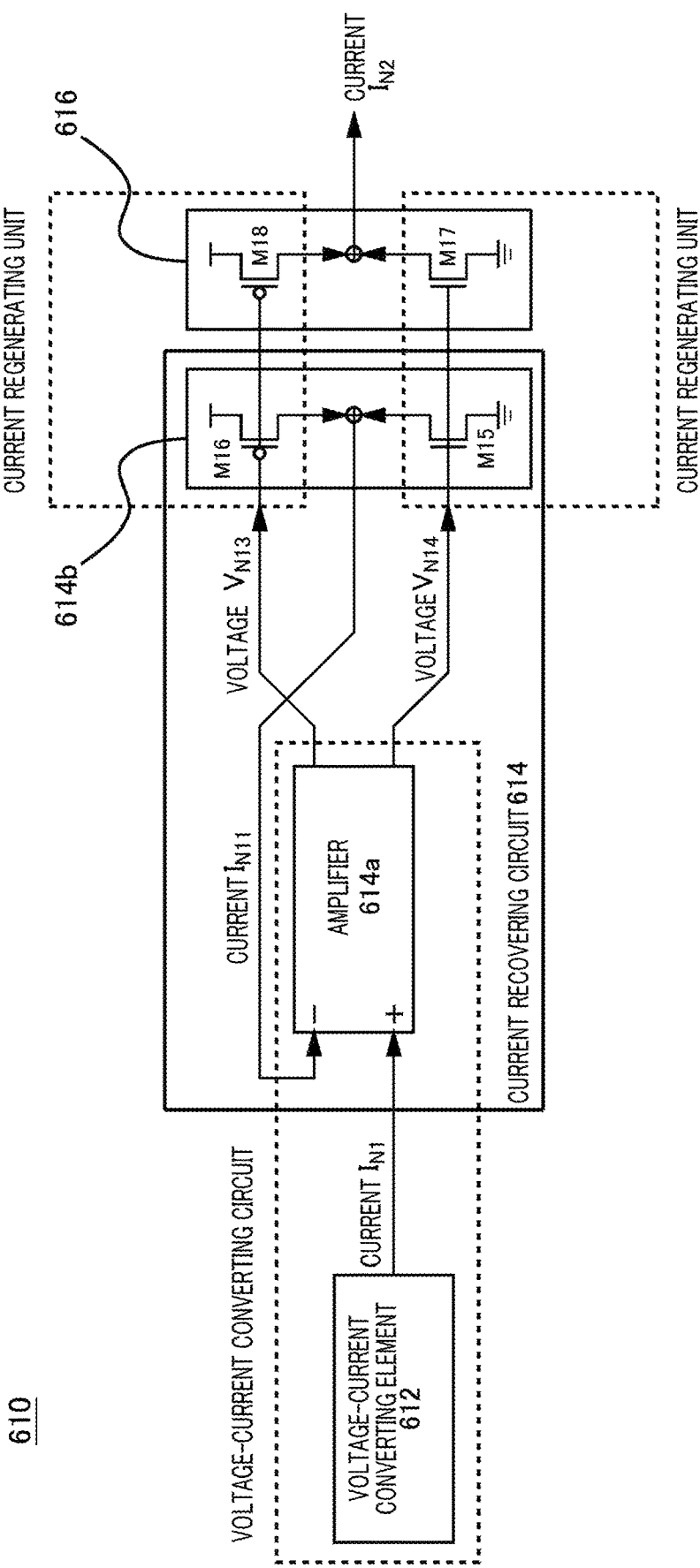
FIG. 8B is a diagram showing an internal configuration of a current recovering circuit 614 shown in FIG. 7.

FIG. 8B is a diagram showing an internal configuration of the current recovering circuit 614 shown in FIG. 7. The current recovering circuit 614 has the amplifier 614a and the current regenerating circuit 614b. The amplifier 614a creates the voltages $VN_{13}$, $V_{N14}$ that are required for the current regenerating circuit 614b to regenerate the current $I_{N11}$. The amplifier 614a compares the current $I_{N1}$ to the current $I_{N11}$, and amplifies the difference component to create the voltages $V_{N13}$, $V_{N14}$. The current regenerating circuit 614b creates the current $I_{N11}$ from the voltages $V_{N13}$, $V_{N14}$. The current regenerating circuit 616 constitutes a current regenerating unit together with the current regenerating circuit 614b.

Figure 9A:
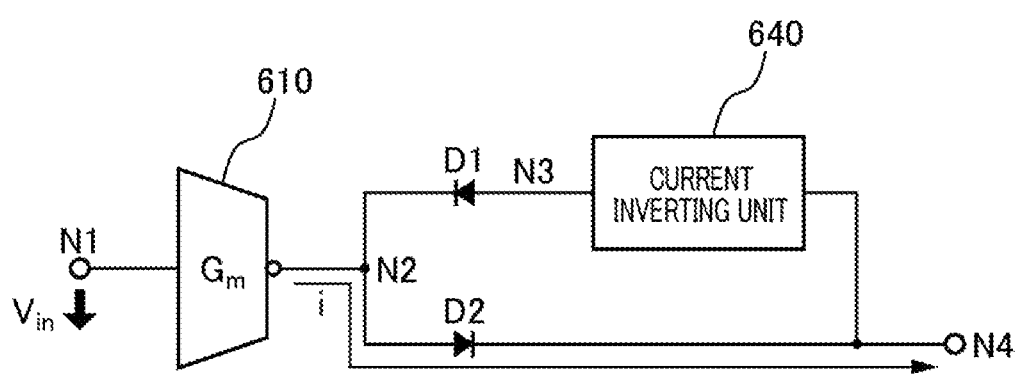
FIG. 9A is a conceptual diagram showing an operation of the rectifying circuit 600 shown in FIG. 6.
Figure 9B:
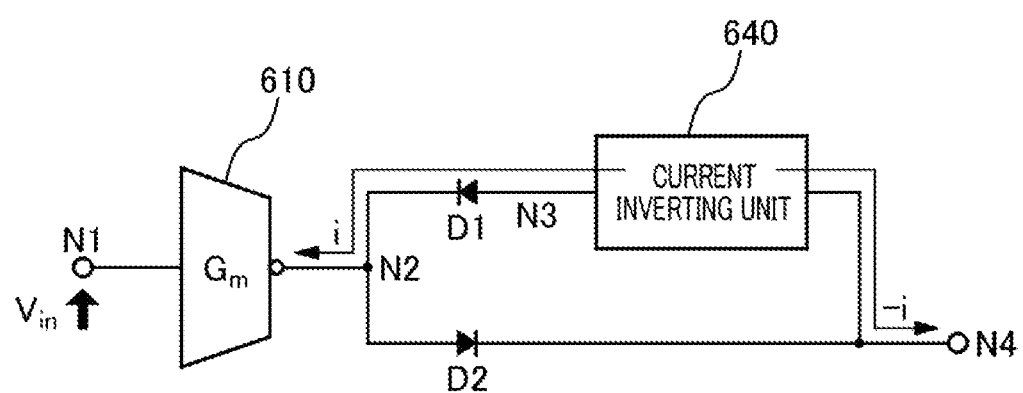
FIG. 9B is a conceptual diagram showing an operation of the rectifying circuit 600 shown in FIG. 6.

FIG. 9A and FIG. 9B are conceptual diagrams showing operations of the rectifying circuit 600 shown in FIG. 6. FIG. 9A and FIG. 9B show relationships between the signal voltage $v_{in}$ applied to N1 and the signal current. Since the direction of the signal current changes depending on a sign of $v_{in}$, the diode D2 is electrically conductive when $v_{in}$<0 as shown in FIG. 9A, and the diode D1 is electrically conductive when $v_{in}$>0 as shown in FIG. 9B. Note that only when the diode D1 is electrically conductive, a signal current i enters the current inverting unit 640, and a signal current -i obtained by inverting the direction reaches N4. As a result, the directions of the current match regardless of the sign of $v_{in}$, and a full-wave rectified output is obtained.

Here, referring again to FIG. 6, an actual signal will be followed. According to Kirchhoff's current laws, it is clear that $I_{N1}=I_{N11}$. Since the voltage of N11 is fixed to the reference potential $V_{com}$ by an action of the negative feedback, the following relationship is established.

$$I_{N1} = I_{N11} = \frac{V_{N1} - V_{com}}{R_0}$$

Therefore, the voltage-current conversion is performed by the resistor $R_0$. This current $I_{N11}$ flows into the transistors M15 and M16 that constitute the class AB output circuit.

When Kirchhoff's current laws are applied to N11 and N2, the relationships $I_{M16}+I_{M15}=I_{N11}$ and $I_{m18}+I_{M17}=-I_{N2}$ are obtained. Further, since the transistors M15 and M17, and the transistors M16 and M18 are 1:1 current mirrors that share the gate voltages, respectively, the relationships $I_{M15}=I_{M17}$ and $-I_{M16}=-I_{18}$ are clearly established. The equations are substituted, which is then arranged, and thus the following relationship is established.

$$I_{N2} = -I_{N11} - \frac{V_{N1} - V_{com}}{R_0}$$

Therefore, it can be confirmed that a whole voltage-current converting unit 610 in FIG. 6 has the characteristics of the voltage-current converting circuit.

Then, a relationship between the required value of a bias current that is required for the rectifying circuit 600, and a maximum output current of the rectifying circuit 600 will be considered. Referring again to FIG. 7, an internal circuit of the operational amplifier A is biased by a bias current $I_2$, but is completely separated from the paths of the signal currents $I_{N2}$ and $I_{N11}$, and, clearly, does not restrict the maximum output current of the rectifying circuit 600. On the other hand, the two class AB output circuits of the transistors M15, M16, and the transistors M17, M18, are paths for the signal currents, and will be subsequently examined.

When $I_{N11}=0$ (that is, when no signal voltage is applied to N1), it is assumed that the class AB output circuit is biased by a bias current $I_3$. Here, when the signal current $I_{N11}$ flows into this, current balances of the transistors M15 and M16 change depending on the amount of currents. Assuming three examples which are $I_{N11}=0$, $I_{N11}\gg I_3$, and $I_{N11}\ll -I_3$, the current in each situation is as follows.

Figure 10A:
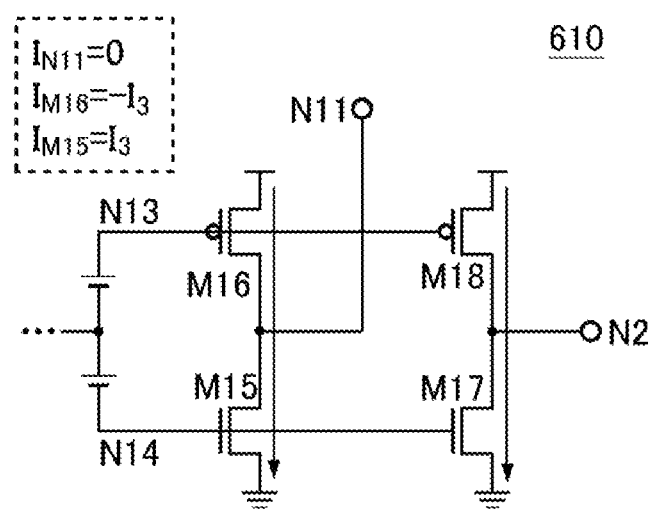
FIG. 10A is a conceptual diagram showing a relationship between a signal current $I_{N11}$ of the rectifying circuit 600 shown in FIG. 6 and a current in a class AB output circuit.
Figure 10B:
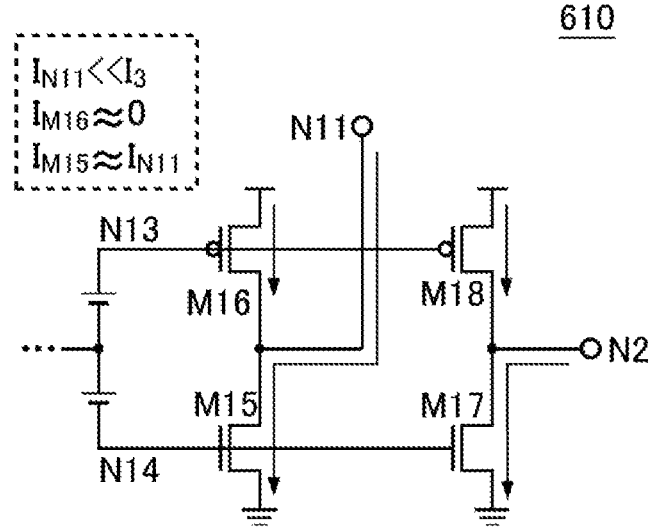
FIG. 10B is a conceptual diagram showing a relationship between the signal current $I_{N11}$ of the rectifying circuit 600 shown in FIG. 6 and the current in the class AB output circuit.
Figure 10C:
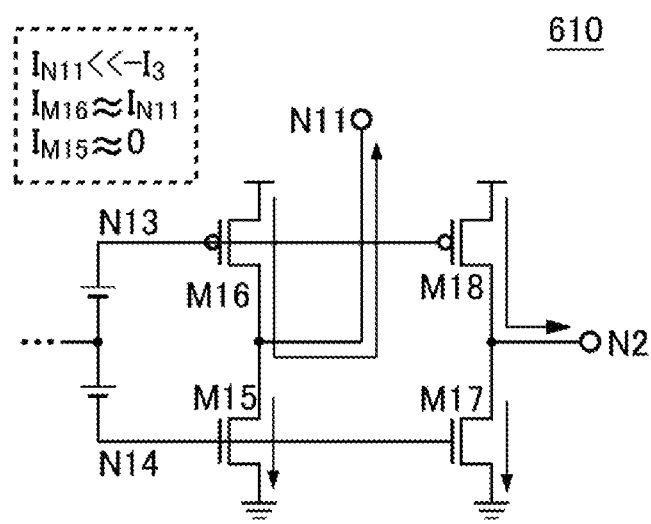
FIG. 10C is a conceptual diagram showing a relationship between the signal current $I_{N11}$ of the rectifying circuit 600 shown in FIG. 6 and the current in the class AB output circuit.

FIG. 10A to FIG. 10C are conceptual diagrams showing relationships between the signal current $I_{N11}$ of the rectifying circuit 600 shown in FIG. 6 and the current in the class AB output circuit. As shown in FIG. 10A, when $I_{N11}$ is near 0, the current flows through both the PMOS (the transistors M16 and M18) and the NMOS (the transistors M15 and M17). On the other hand, in the situations of FIG. 10B and FIG. 10C, the currents flow through almost only the NMOS, or almost only the PMOS. For example, in FIG. 10B, the following relationship is established.

$$I_{M16} \neq 0$$

However, the signal current $I_{N11}$ is wholly recovered on a transistor M15 side, and the relationship: $I_{N2}=I_{N11}$ is established by the current mirror of the transistors M15 and M17. The same applies to FIG. 10C, and in this case, a current mirror circuit on a PMOS side survives and ensures a normal operation.

Figure 11:
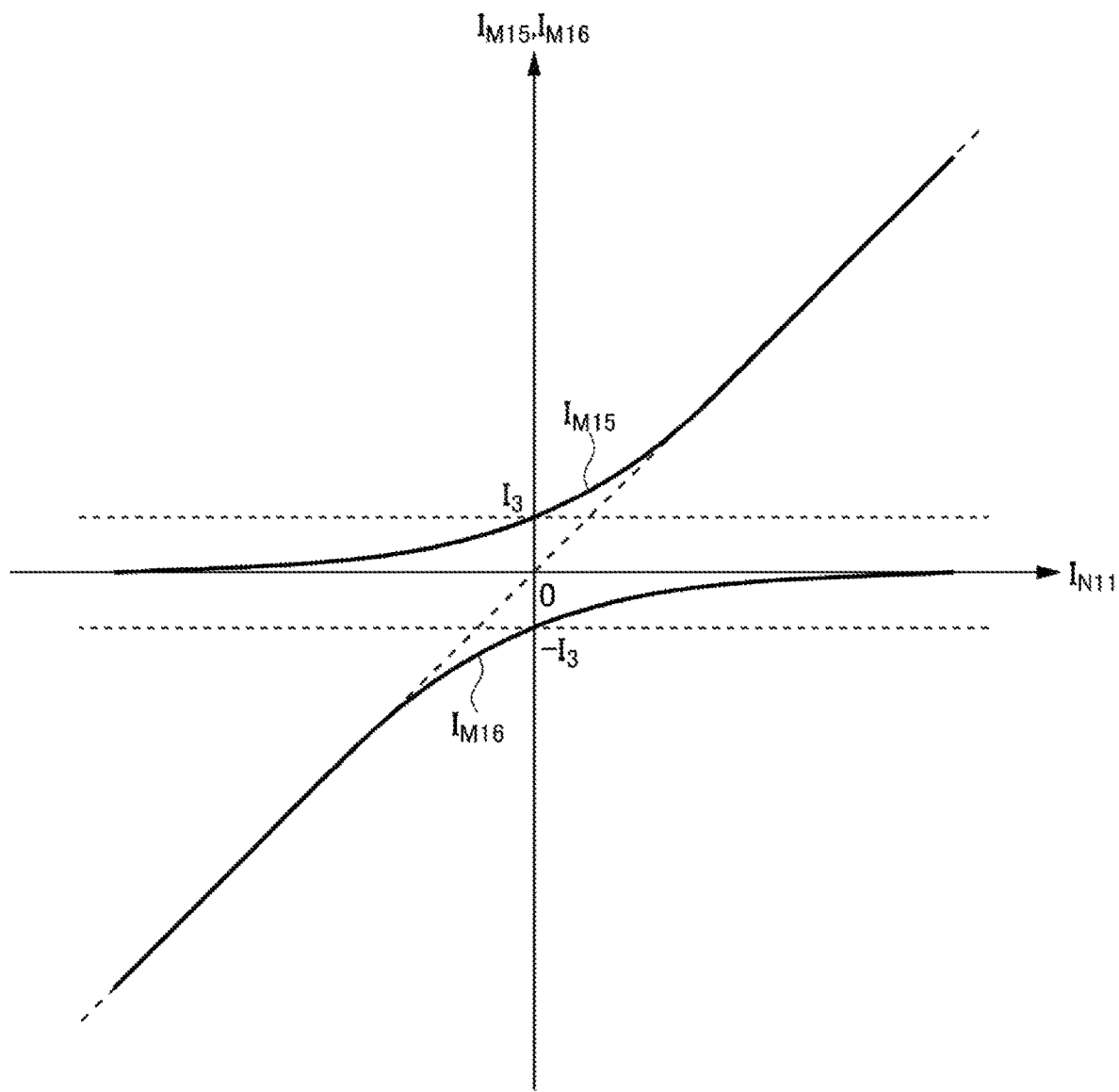
FIG. 11 is a graph showing transition of a current for the signal current $I_{N11}$ of the rectifying circuit 600 shown in FIG. 6 and the current in the class AB output circuit.

FIG. 11 is a graph showing transition of a current for the signal current $I_{N11}$ of the rectifying circuit 600 shown in FIG. 6, and the current in the class AB output circuit. When the signal current $I_{N11}$ is close to 0, both of the PMOS and the NMOS operate, and when $|I_{N11}|$ rises (the operating point moves to an outside of the graph), although the current on one side is exhausted, the operation is made in a manner that the signal current $I_{N11}$ is recovered only by the current on the opposite side. From this graph, it can also be confirmed that the bias current $I_3$ controls the transition point at which the operation is shifted to only one side of the transistors, but does not restrict a magnitude of the signal current $I_{N11}$. The above described discussion has shown that the bias currents $I_2$ and $I_3$ can be set independently of the maximum value of the output current of the rectifying circuit.

Next, the current inverting unit 640 will be described. As shown in FIG. 7, in the current inverting unit 640, the current mirror circuit is used as a current inverting circuit after the current passes through the diode. The bias current $I_1$ of this circuit does not limit the maximum output current. This point will be described in detail.

Figure 12A:
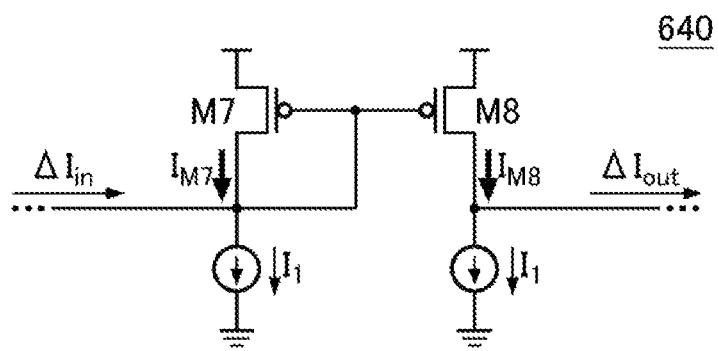
FIG. 12A is a conceptual diagram showing an operation of a current inverting unit 640 shown in FIG. 7.
Figure 12B:
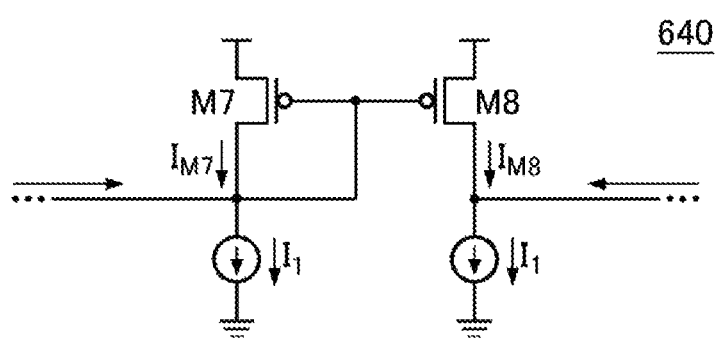
FIG. 12B is a conceptual diagram showing an operation of the current inverting unit 640 shown in FIG. 7.
Figure 12C:
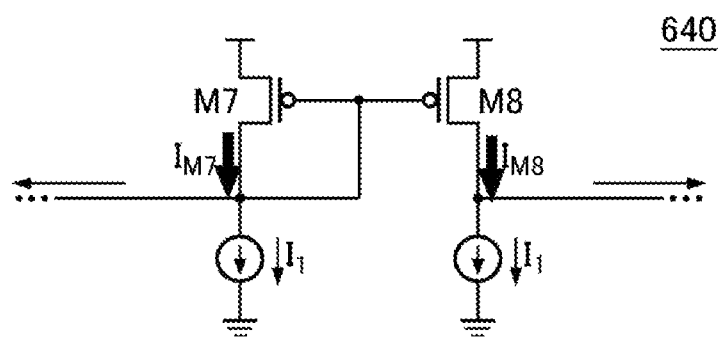
FIG. 12C is a conceptual diagram showing an operation of the current inverting unit 640 shown in FIG. 7.

FIG. 12A to FIG. 12C are conceptual diagrams showing operations of a current inverting unit 640 shown in FIG. 7. Now, as shown in FIG. 12A, the current flowing from the N3 side into the current mirror circuit is defined as $\Delta I_{in}$, and the output current is defined as $\Delta I_{out}$. From Kirchhoff's current laws, the relationships $I_{M7}=I_1-\Delta I_{in}$ and $I_{M8}=I_1+\Delta I_{out}$ are established. Further, the transistors M7 and M8 are the current mirrors, which leads to the relationship $I_{M7}=I_{M8}$. As a result, the relationship between $\Delta I_{in}$ and $\Delta I_{out}$ is expressed as $\Delta I_{out}=-\Delta I_{in}$. Therefore, it can be confirmed that the current is inverted.

FIG. 12B and FIG. 12C show a sign of $\Delta I_{in}$ and the direction of the current at the time for the sign. Thicknesses of arrows of $I_{M7}$, $I_{M8}$ indicate the amount of currents. Note that $I_{M7}>0$ is required for this current mirror circuit to operate correctly. This is because when $I_{M7}=0$, if a current of $\Delta I>I_1$ flows in, the resulting output is $\Delta I_{out}=I_{M8}-I_1=I$ calculated from the equation $I_{M7}=I_{M8}=0$ and is not a correct output. As shown in FIG. 12B, when $\Delta I_{in}>0$, $I_{M7}$ decreases, and an operational limit, which is $I_{M7}>0$, exists in the operation in this direction of the current.

Figure 13:
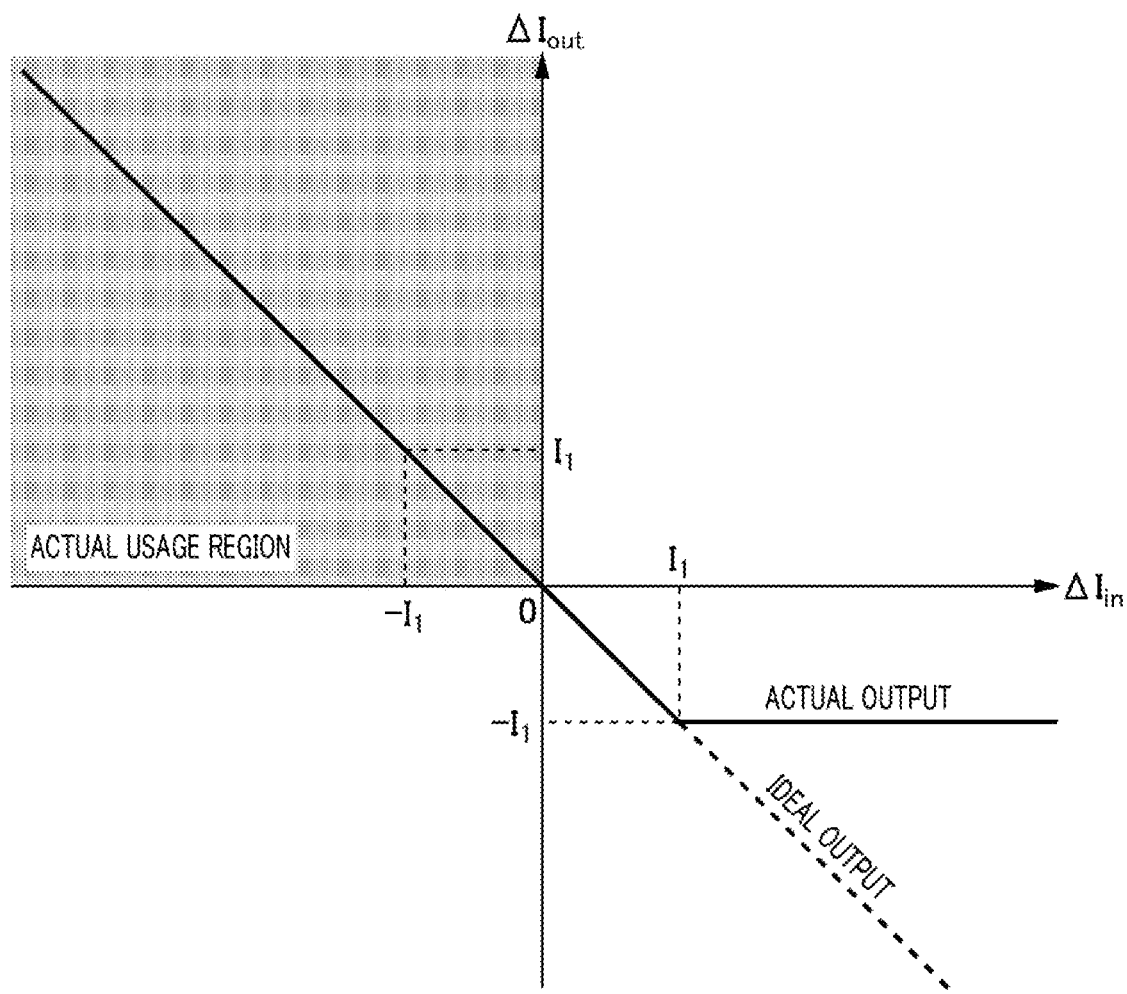
FIG. 13 is a graph showing input/output characteristics of the current inverting unit 640 shown in FIG. 7.

FIG. 13 is a graph showing input/output characteristics of the current inverting unit 640 shown in FIG. 7. A horizontal axis represents $\Delta I_{in}$ and a vertical axis represents $\Delta I_{out}$. As shown in FIG. 13, a region to which the above described operational limit is applied corresponds to a region of $\Delta I_{in} > I_1$ in the graph.

However, the problem of this operational limit does not affect the operation of the rectifying circuit 600. As shown in FIG. 9A and FIG. 9B, the signal current flows through the current inverting unit 640 only in the situation of FIG. 9B. That is, the fact that the signal current flows through the current inverting unit 640 is limited to a case where $\Delta I_{in} < 0$ from the definition in FIG. 12A, and a shaded range in FIG. 13 is an actual usage region. Accordingly, the region of $\Delta I_{in} > I_1$ limited by the bias current $I_1$ is not used at all. That is, the bias current $I_1$ can be set regardless of the maximum output value of the rectifying circuit.

Figure 14:
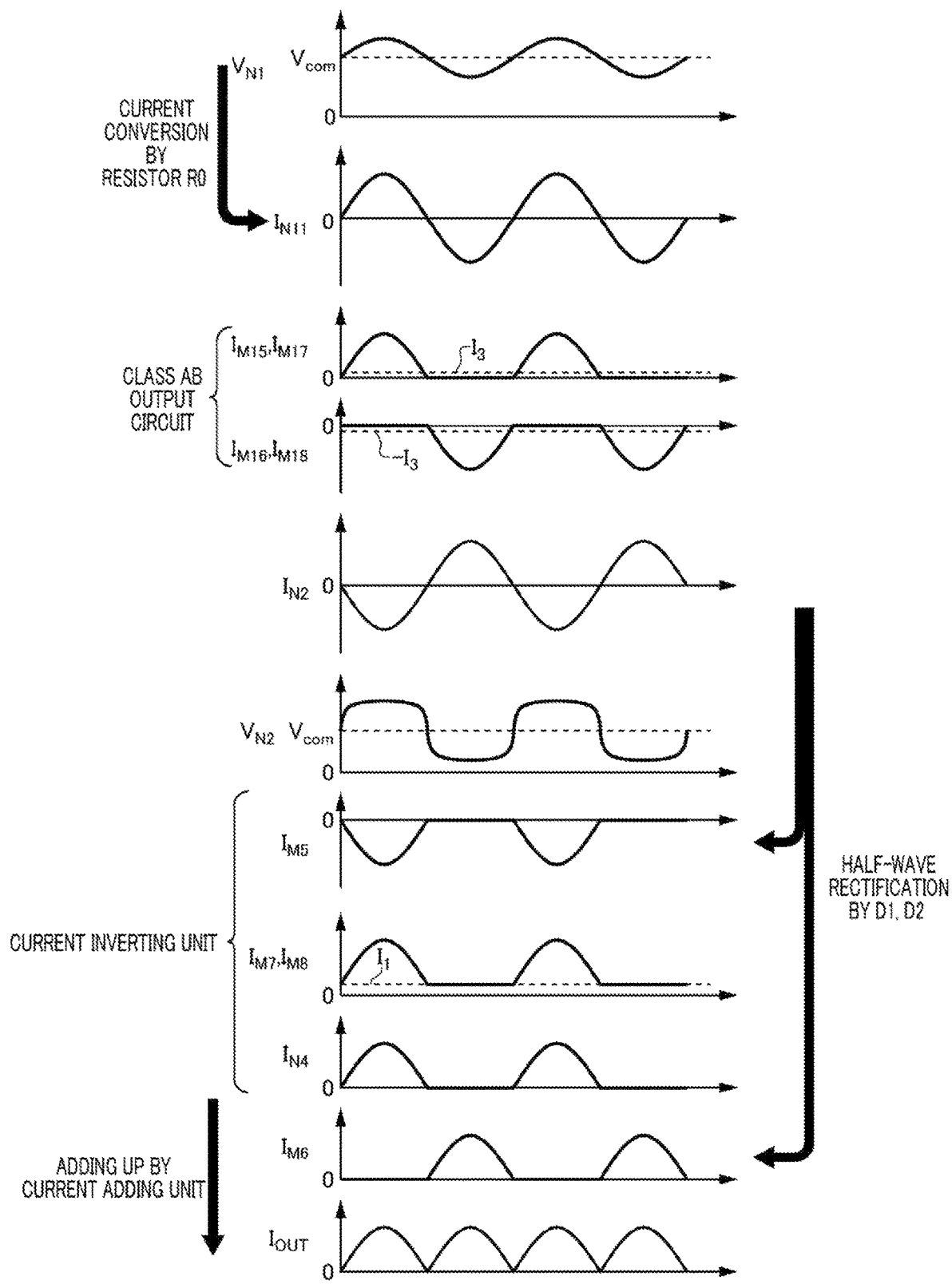
FIG. 14 shows a graph showing an operation waveform for each node of the rectifying circuit 600 shown in FIG. 6.

FIG. 14 shows a graph showing an operation waveform for each node of the rectifying circuit 600 shown in FIG. 6. The potential $V_{N1}$ at N1 is assumed to be a sine wave centered on the reference potential $V_{com}$. The voltage $V_{N1}$ is converted into the signal current $I_{N11}$, which has the same frequency and the same phase, by the resistor $R_0$ (the voltage-current converting element 612). The current $I_{N11}$ flows into the transistors M15 and M16 (the current regenerating circuit 614b) of the class AB output circuit so as to become the currents $I_{M15}$ and $I_{M16}$, and the currents $I_{M15}$ and $I_{M16}$ are mirrored by the transistors M17 and M18 (the current regenerating circuit 616) of the class AB output circuit so as to become currents $I_{M17}$ and $I_{M18}$. The currents $I_{M17}$ and $I_{M18}$ are added together to be output as the $I_{N2}$.

Then, the current $I_{N2}$ flows to the diode D1 (the current half-wave rectifying unit 620) as the current $I_{M6}$ when $v_{in} > 0$, and flows into the diode D2 (the current half-wave rectifying unit 630) as the current $I_{M5}$ when $v_{in} < 0$. When the current flows through the diode D1, the current $I_{M5}$ is input to the transistor M7 (the current inverting circuit 640) as the current $I_{M7}$, and the current $I_{M7}$ is mirrored by the transistor M8 (the current inverting circuit 640) so as to become the current $I_{M8}$. The current $I_{M8}$ is output as the current $I_{N4}$ obtained by inverting the current $I_{M5}$. The current adding unit 650 adds up the currents $I_{N4}$ and $I_{M5}$ to output $I_{OUT}$. As described above, it is understood that a full-wave rectified waveform can be obtained by the rectifying circuit 600.

Further, as described above, in the rectifying circuit according to the present embodiment, the bias current does not limit the maximum value of the signal current in any circuit block. Therefore, it is possible to use a very small bias current value, and it is possible to significantly reduce the current consumption.

Further, in the rectifying circuit according to the present embodiment, since the voltage-current conversion is performed not by $g_m$ of the transistor but by the resistance, the voltage-current conversion coefficient is unlikely to vary. At the same time, it is indicated that since the voltage-current conversion coefficient can be set independently of the bias current, the voltage-current conversion coefficient can be set to be large to some extent also for setting a minute bias current.

Further, in the rectifying circuit according to the present embodiment, the offset current is generated mainly in an input offset voltage of the operational amplifier A, the class AB output circuit of the current mirror, and the current inverting circuit, which total three. Of these, the input offset voltage of the operational amplifier A can be simply dealt with by a well-known technique such as insertion of a DC cut capacitor, and the other two offsets can be greatly reduced by designing the bias current to be small. As a result, it is possible to achieve an output DC offset that is significantly smaller than the related art.

Note that the current inverting unit 640 is not limited to the configuration of FIG. 7, and may be another current amplifying circuit. For example, the current inverting unit 640 is provided to further include transistors M7A and M7B of a current mirror such that the transistor M7A is connected to the reference potential $V_{com}$ and that the transistor M7B is interposed between N3 and the transistor M7. Thereby, the voltage of N3 is fixed near the reference potential $V_{com}$, and a stability of the operating point of the rectifying diode M6 can be improved.

Note that although the operational amplifier A is shown as the differential amplifier in FIG. 6, a current amplifier that substantially has the class AB output may be used. The current amplifier is a circuit that ideally has an input impedance of 0 and outputs a current source by constant multiplication of a current which has flowed in.

Further, the most important functions of the class AB output circuit in FIG. 7 are that (1) the signal currents are fed back via the PMOS and the NMOS of a buffer part, and (2) the signal currents respectively created by the PMOS and the NMOS merge somewhere on a drain side of each MOS. As long as these conditions are satisfied, the configuration of the class AB output circuit is not limited.

Figure 8C:
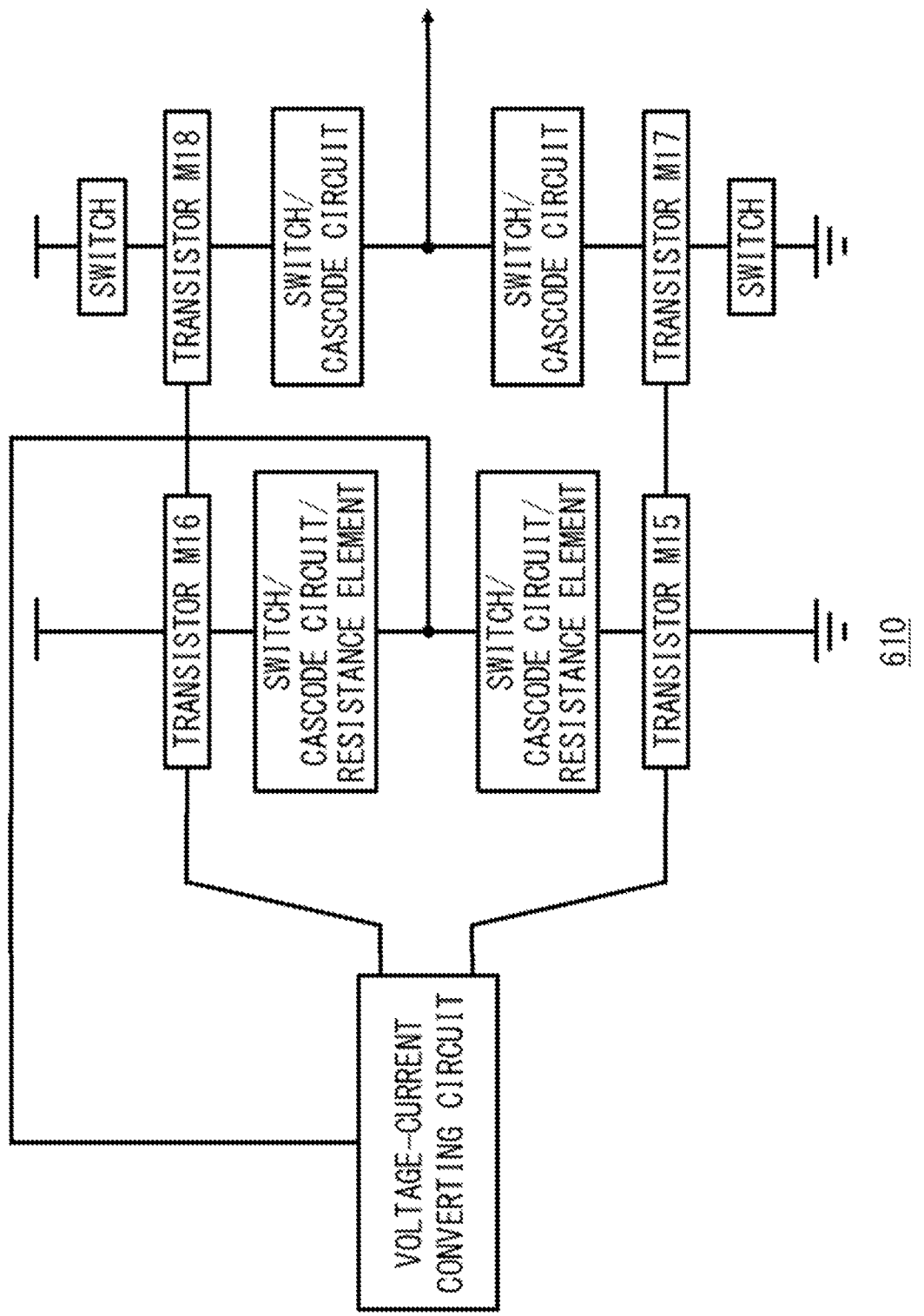
FIG. 8C is a diagram showing an internal configuration of a voltage-current converting unit 610 shown in FIG. 7.

FIG. 8C is a diagram showing an internal configuration of a voltage-current converting unit 610 shown in FIG. 7. The voltage-current converting unit 610 may have a switch on drain sides or source sides of the PMOS and the NMOS that constitute the class AB output circuit. Thereby, it is possible for the current consumption to be 0 when the class AB output circuit is not used. Even in a case of turning on the switch on the source side, the same effect as in FIG. 7 can be obtained as long as impedance is sufficiently low.

The voltage-current converting unit 610 may have a cascode circuit between the transistor M15 and the transistor M16, between the transistor M17 and the transistor M18, or at both of the locations. The cascode circuit may be provided in both of the PMOS and the NMOS, or may be provided only on the PMOS side or only on the NMOS side.

The voltage-current converting unit 610 may have a resistor, a switch, or both of them, which are provided in the negative feedback circuit from the class AB output circuit of the transistors M15 and M16 to N11.

The voltage-current converting unit 610 may be configured by combining the above described variations. For example, the voltage-current converting unit 610 may have the cascode circuit between the transistor M15 and the transistor M16, and may have switches on the source sides and the drain sides of the transistors M17 and M18, respectively.

Alternatively, in the voltage-current converting unit 610, the current mirror may be constituted by source degeneration. Since the source degeneration makes it possible to provide an upper limit value to the $g_m$ value of the MOS by a resistor inserted on the source side, an abrupt variation of an open-loop gain is suppressed even at the time of the large amplitude input, and as a result, stabilization can be achieved.

The rectifying circuit 600 performs the inversion and the addition in a current dimension, but is not limited to this. The rectifying circuit 600 may perform the inversion and the addition in a voltage dimension or a digital dimension. A current on a diode D2 side may be inverted in the voltage dimension, be converted into a current again, and then be added. Alternatively, the current on the D2 side may be converted in the voltage dimension and be added by using a virtual short circuit effect of the operational amplifier. Alternatively, the current may be converted into the voltage and then be converted into a digital value through an A/D converter.

The current inverting unit 640 may be provided on a current half-wave rectifying unit 630 side rather than a current half-wave rectifying unit 620 side, and may invert a current on the current half-wave rectifying unit 630 side. An input/output relationship of the full-wave rectifying circuit may be $I_{OUT}=|v_{in}/R_0|$, or may be $I_{OUT}=-|v_{in}/R_0|$.

As described above, the rectifying circuit according to the present embodiment connects, as the current mirror circuit, the class AB output circuit (the transistors M15 and M16), which is included in the negative feedback circuit, to the class AB output circuit (the transistors M17 and M18), of which an output part is connected to the rectifying diode (the diodes D1 and D2) without the negative feedback being applied. In other words, the rectifying circuit according to the present embodiment has the class AB output circuit in the negative feedback, the class AB output circuit without the negative feedback being applied, and the rectifying diode.

An output DC offset component in the rectifying circuit is generated by an offset current, which is proportional to the bias current of the transistor, leaking from the rectifying diode. In the configuration of the open-loop voltage-current converting circuit and the rectifying diode as in FIG. 2 and FIG. 3B, a part of the bias current is output as a signal current, and thus a bias current which is large to some extent is required to obtain a large output amplitude. Therefore, when the output amplitude of the rectifying circuit is made to be large, the output DC offset and the current consumption become large.

When the rectifying circuit is configured with a configuration of the class AB output plus the rectifying diode as shown in FIG. 5, the voltage-current conversion coefficient depends on $g_m$, and it is required to increase the bias current to obtain a sufficient output signal current.

In the configuration of the present embodiment, with respect to the class AB output circuit (the transistors M17 and M18) connected to the rectifying diode, the other class AB output circuit (the transistors M15 and M16) with the negative feedback being applied makes the current mirror connection, and the signal current, which is recovered by the class AB output circuit (the transistors M15 and M16) with the negative feedback being applied, is output from the class AB output circuit (the transistors M17 and M18) connected to the rectifying diode. In the class AB output circuit (the transistors M15 and M16) with the negative feedback being applied, the resistor $R_0$ is used for the signal voltage to be converted into the signal current by the virtual short circuit (the voltage of N11 matches $V_{com}$) effect which is caused by the gain of the negative feedback, and the signal current is recovered. Both of the class AB output circuits can operate by the recovered signal current alone as well, and thus a very small bias current is allowed. As a result, with this configuration, the present embodiment simultaneously achieves the low current consumption, the low DC offset, and a large amplitude output.

Figure 15:
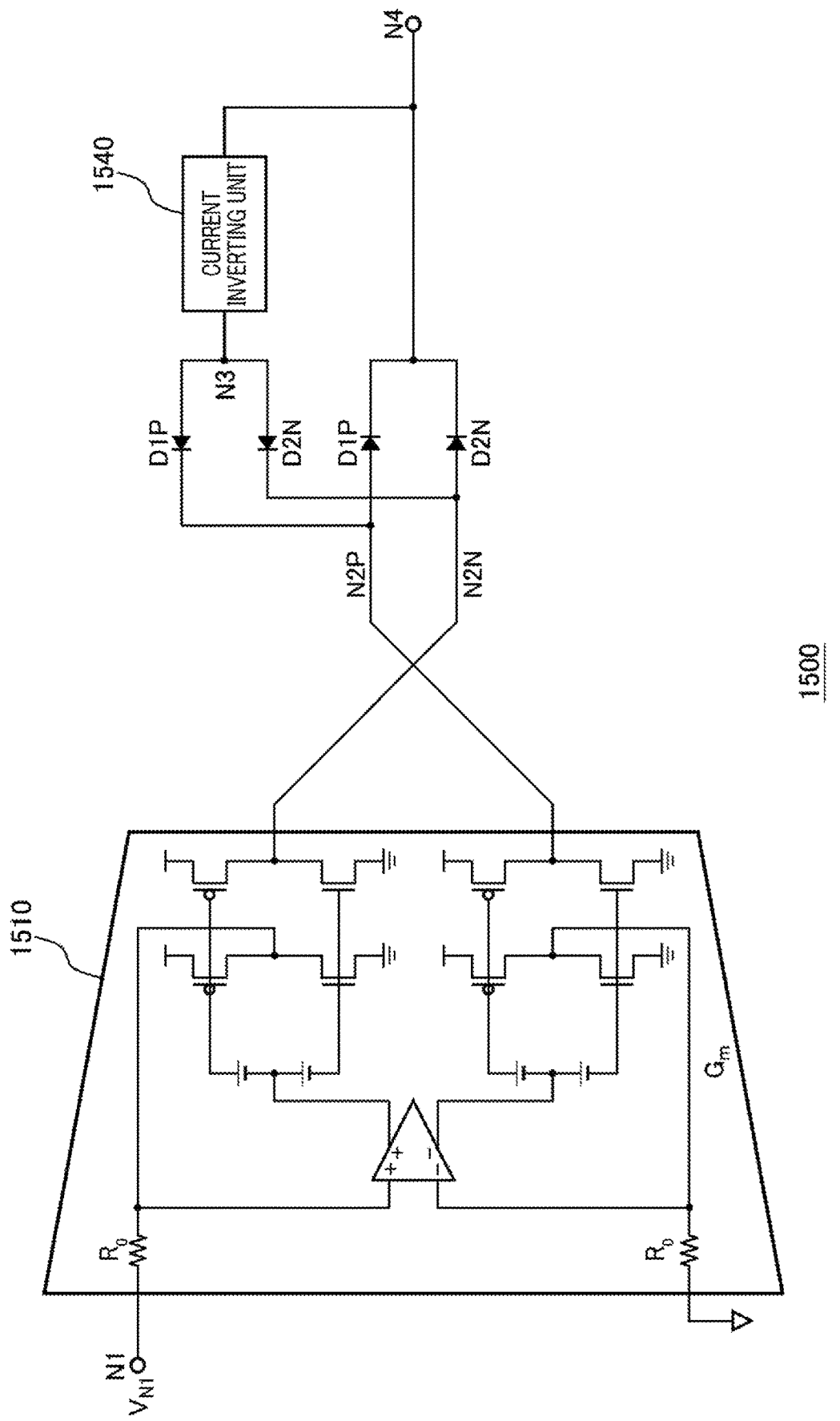
FIG. 15 is a conceptual diagram showing a modification example of a rectifying circuit 1500 according to the present embodiment.

FIG. 15 is a conceptual diagram showing a modification example of a rectifying circuit according to the present embodiment. In FIG. 6, the output of the operational amplifier A is a single-ended output, but can be configured to be a differential output. A basic concept is as shown in FIG. 15, and a rectifying circuit 1500 has a voltage-current converting unit 1510, a current inverting unit 1540, a set of two diodes D1P, and a set of two diodes D2N. The sets of diodes D1P and D2N are rectifying diodes. The voltage-current converting unit 1510 has two differential output terminals N2P and N2N, which are connected to the sets of rectifying diodes D1P and D2N, respectively. The sets of rectifying diodes D1P and D2N separately recover both of a signal current in a positive direction and a signal current in a negative direction, collectively convert only the signal current in the negative direction into the signal current in the positive direction, through the current inverting unit 1540, and add the converted signal current to the signal current that has passed through the rectifying diodes in the positive direction so as to achieve the full-wave rectification.

Figure 16:
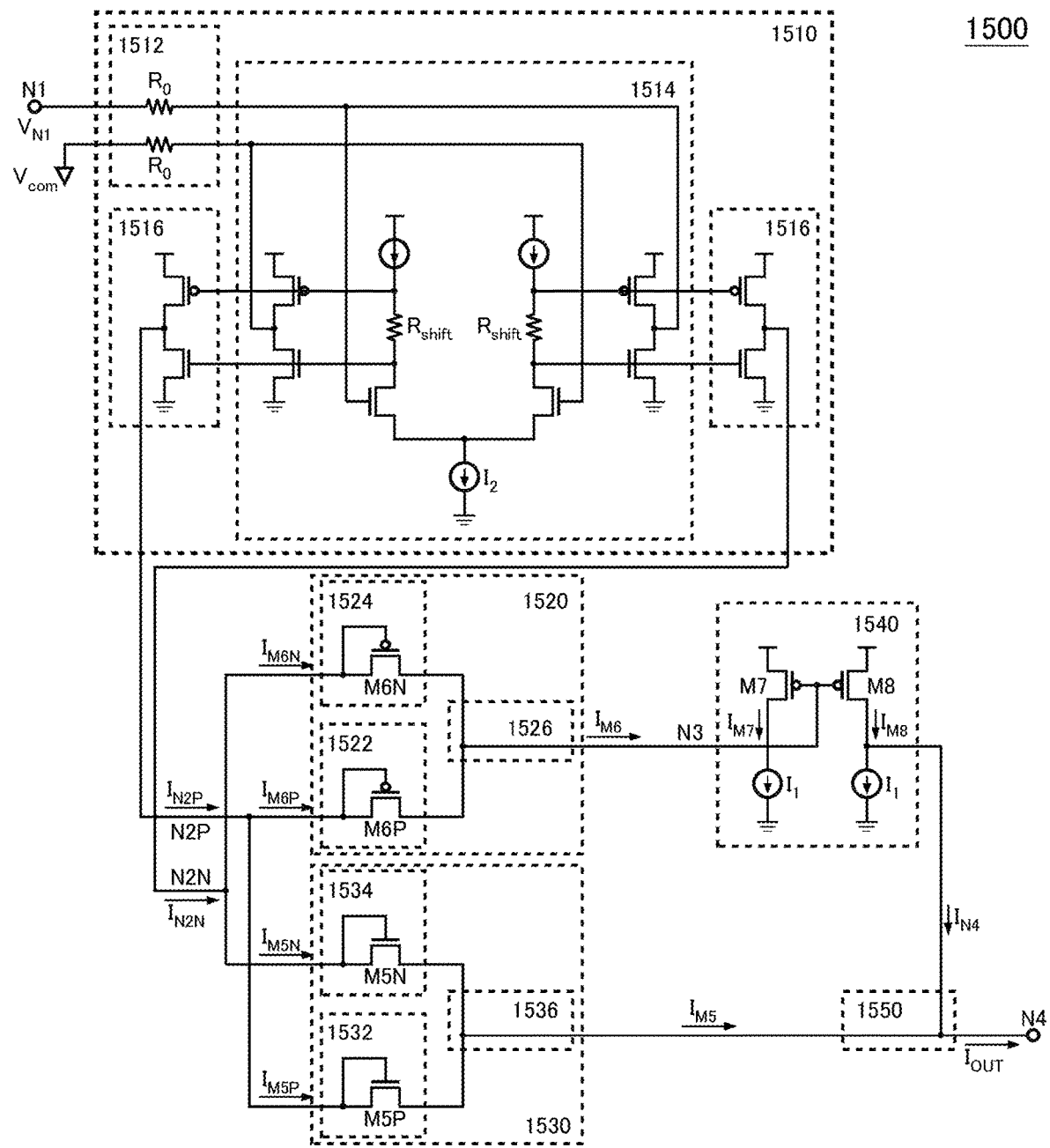
FIG. 16 is a circuit diagram showing a configuration example of the rectifying circuit shown in FIG. 15.

FIG. 16 is a circuit diagram showing a configuration example of the rectifying circuit 1500 shown in FIG. 15. The voltage-current converting unit 1510 has a voltage-current converting element 1512, a current recovering circuit 1514, and a current regenerating circuit 1516. As an example, the voltage-current converting element 1512 is a resistor $R_0$. The current recovering circuit 1514 is a single differential converting circuit using a fully differential operational amplifier, and outputs signal currents $I_{N2P}$ and $I_{N2N}$ to the differential output terminals N2P and N2N, respectively, in combination with the two current mirror circuits 1516. A subsequent discussion is almost the same as in FIG. 7, and will be omitted.

Figure 17:
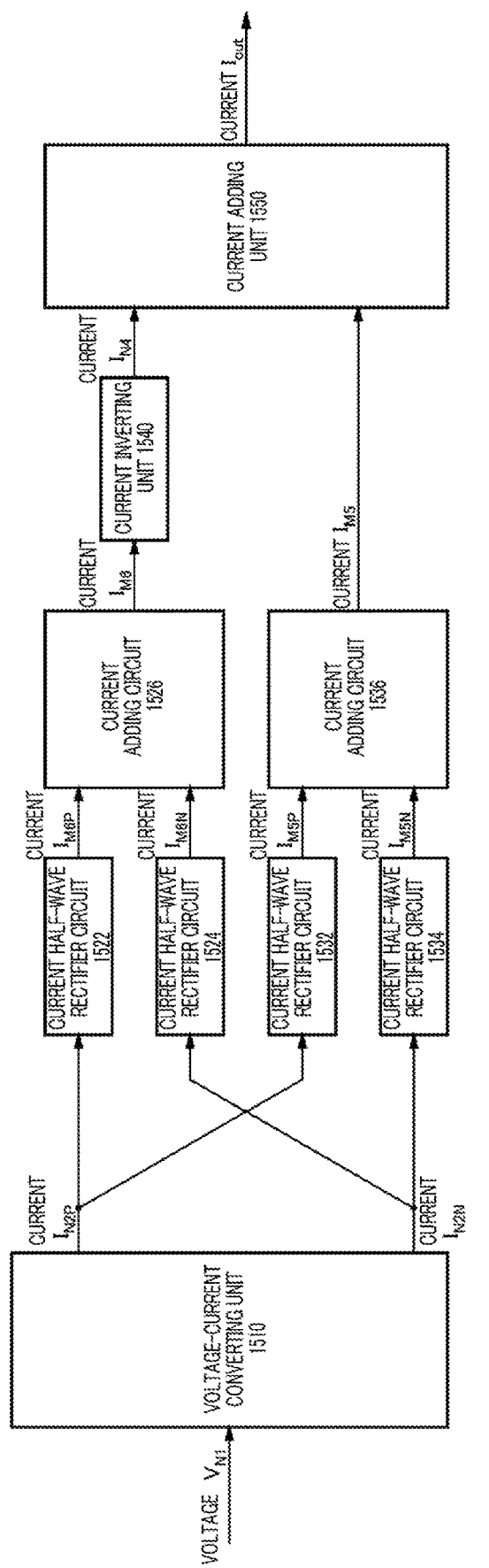
FIG. 17 is a block diagram corresponding to FIG. 16.

FIG. 17 is a block diagram corresponding to FIG. 16. The rectifying circuit 1500 has functional blocks such as current half-wave rectifying units 1520 and 1530, and a current adding unit 1550 in addition to the functional blocks described with reference to FIG. 16. The current half-wave rectifying unit 1520 has current half-wave rectifying circuits 1522 and 1524, and a current adding circuit 1526. The current half-wave rectifying circuits 1522 and 1524 have transistors M6P and M6N, which correspond to the diodes D1P and D2N, respectively. The current half-wave rectifying unit 1530 has current half-wave rectifying circuits 1532 and 1534, and a current adding circuit 1536. The current half-wave rectifying circuits 1532 and 1534 have transistors M5P and M5N, which correspond to the diodes D1P and D2N, respectively. Note that the blocks inside the voltage-current converting unit 1510 are common to the case of FIG. 8A, and a description thereof will be omitted.

A voltage $V_{N1}$ is an input signal voltage applied to N1 in FIG. 16. The current $I_{N2P}$ is a signal current which has an amplitude proportional to an amplitude of the voltage $V_{N1}$, and has the same frequency and the same phase as the voltage $V_{N1}$. The current $I_{N2N}$ is a signal current which has the same amplitude and the same frequency as the $I_{N2P}$, and has a phase 180 degrees different from the $I_{N2P}$. A current $I_{M6}$, of a signal current $I_{N2}$, is a signal current set to be 0 in a section where the signal current $I_{N2}$ is positive. A current $I_{M5}$, of the signal current $I_{N2}$, is a signal current set to be 0 in a section where the signal current $I_{N2}$ is negative. A current $I_{N4}$ is a signal current obtained by inverting the sign of the signal current $I_{M6}$. A current $I_{OUT}$ is a signal current which is the sum of the signal current $I_{M5}$ and the signal current $I_{N4}$.

The voltage-current converting unit 1510 converts the input voltage $V_{N1}$ into the signal currents $I_{N2P}$, $I_{N2N}$. The current half-wave rectifying circuit 1522 takes out only a negative side of the signal current $I_{N2P}$, and outputs 0 when the signal current $I_{N2p}$ is positive. The current half-wave rectifying circuit 1524 takes out only a negative side of the signal current $I_{N2N}$, and outputs 0 when the signal current $I_{N2N}$ is positive. The current adding circuit 1526 outputs the signal current $I_{M6}$ which is the sum of a signal current $I_{M6P}$ and a signal current $I_{M6N}$. The current half-wave rectifying circuit 1532 takes out only a positive side of the signal current $I_{N2P}$, and outputs 0 when the signal current $I_{N2P}$ is negative. The current half-wave rectifying circuit 1534 takes out only a positive side of the signal current $I_{N2N}$, and outputs 0 when the signal current $I_{N2N}$ is negative. The current adding circuit 1536 outputs the signal current $I_{M5}$ which is the sum of a signal current $I_{M5P}$ and a signal current $I_{M5N}$. The current inverting unit 1540 inverts the sign of the signal current $I_{M6}$. The current adding unit 1550 outputs the signal current $I_{OUT}$ which is the sum of the signal current $I_{M5}$ and the signal current $I_{N4}$. Note that the current adding circuit 1536 may be a part of the current adding unit 1550.

Figure 18A:
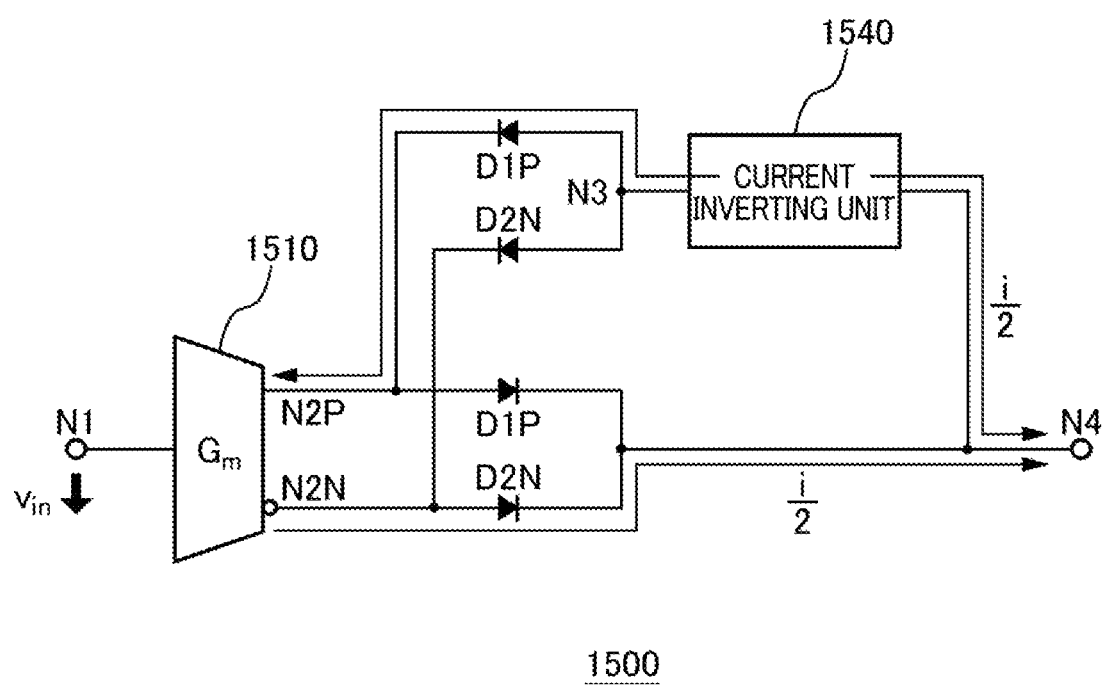
FIG. 18A is a conceptual diagram showing an operation of the rectifying circuit 1500 shown in FIG. 15.
Figure 18B:
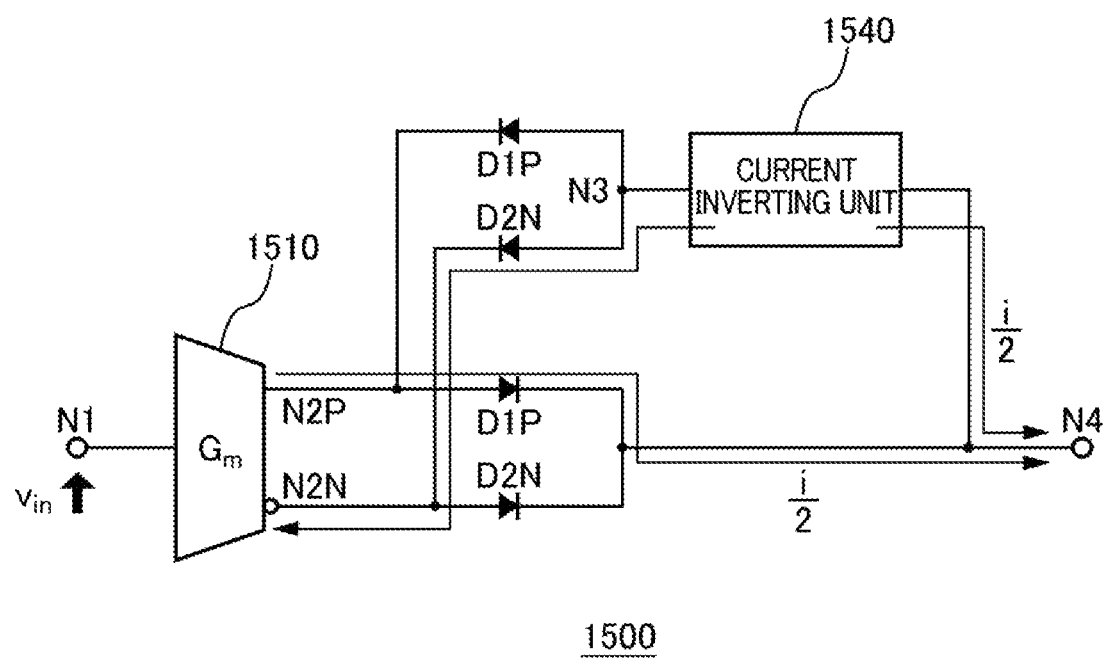
FIG. 18B is a conceptual diagram showing an operation of the rectifying circuit 1500 shown in FIG. 15.

FIG. 18A and FIG. 18B are conceptual diagrams showing operations of the rectifying circuit 1500 shown in FIG. 15. FIG. 18A and FIG. 18B show relationships between the signal voltage $v_{in}$ applied to N1 and the signal current. The direction of the signal current changes depending on the sign of $v_{in}$, and thus as shown in FIG. 18A, when $v_{in}<0$, the diode D1P (the current half-wave rectifying circuit 1522) of the current half-wave rectifying unit 1520 and the diode D2N (the current half-wave rectifying circuit 1534) of the current half-wave rectifying unit 1530 are electrically conductive, and as shown in FIG. 18B, when $v_{in}>0$, the diode D2N (the current half-wave rectifying unit 1524) of the current half-wave rectifying unit 1520 and the diode D1P (the current half-wave rectifying circuit 1532) of the current half-wave rectifying unit 1530 are electrically conductive. Note that a signal current i/2, which passes through the current half-wave rectifying circuit 1522 or the current half-wave rectifying unit 1524, flows into the current inverting unit 1540, and the direction of the signal current i/2 is inverted for the signal current i/2 to reach N4. In comparison with FIG. 9A and FIG. 9B, each signal current is halved; however, any signal current in the current half-wave rectifying circuit reaches N4, and thus finally obtained signal currents are equivalent to those shown in FIG. 9A and FIG. 9B.

As described above, the present embodiment relates to the full-wave rectifying circuit that is characterized by the low current consumption and the low DC offset, and that has the voltage-current converting circuit, which uses the class AB output circuit with the negative feedback being applied, make the current mirror connection to the other class AB output circuit in which the output unit is connected to the rectifying diode without the negative feedback being applied.

As a rectifying circuit for a high frequency, there is a rectifying circuit in which an open-loop voltage-current converting circuit and a plurality of rectifying diodes are combined. However, a large bias current is required to obtain a sufficient output signal current in the open-loop voltage-current converting circuit, and an output DC offset of the rectifying circuit that is proportional to a bias current becomes large.

In the present invention, the voltage-current converting circuit uses the two-stage operational amplifier that has the class AB output with the negative feedback being applied and that does not include a diode. The signal current converted from the signal voltage by the negative feedback is recovered by the class AB output circuit, and is shifted to the other class AB output circuit by the current mirror such that the signal current is rectified. Since both of the class AB output circuits can operate by the recovered signal current alone as well, the bias current supplied to the class AB output circuit can be made to be small and the output DC offset of the rectifying circuit can be greatly reduced. Further, the current inverting circuit required for the full-wave rectification of the rectifying circuit also operates by a low bias current. As a result, the full-wave rectifying circuit of the present invention can operate with the low current consumption regardless of the fact that the low offset and the large amplitude output is possible.

Various embodiments of the present invention described above may be described with reference to flowcharts and block diagrams. Blocks in the flowcharts and block diagrams may represent (1) steps of processes in which operations are performed or (2) "units" of apparatuses responsible for performing operations. Certain steps and "units" may be implemented by dedicated circuitry, programmable circuitry supplied with computer-readable instructions stored on computer-readable media, and/or processors supplied with computer-readable instructions stored on computer-readable media. [0088]. Note that dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device. Thereby, the computer-readable medium having instructions stored in the tangible device comprises an article of manufacture including instructions which can be executed to create means for performing operations specified in the flowcharts or block diagrams.

Examples of computer-readable media may include an electronic storage medium, a magnetic storage medium, an optical storage medium, an electromagnetic storage medium, a semiconductor storage medium, etc. More specific examples of computer-readable media may include a floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY (registered trademark) disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, etc. Further, computer-readable instructions may include either source code or object code written in any combination of one or more programming languages, including an object oriented programming language such as Smalltalk, JAVA (registered trademark), C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), wide area network (WAN) such as the Internet, etc. Thereby, it possible for a processor of a general purpose computer, special purpose computer, or other programmable data processing apparatus, or for programmable circuitry to execute the computer-readable instructions to create means for performing operations specified in the flowcharts or block diagrams. Examples of processors include computer processors, processing units, microprocessors, digital signal processors, controllers, microcontrollers, etc.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE NUMBERS

100: rectifying circuit, 110: operational amplifier, 120: operational amplifier, 200 rectifying circuit, 210: operational amplifier, 300: rectifying circuit, 310: $G_m$ cell, 500: rectifying circuit, 600: rectifying circuit, 610 voltage-current converting unit, 612: voltage-current converting element, 614: current recovering circuit, 614a: amplifier, 614a, 614b: current regenerating circuit, 616: current regenerating circuit, 620: current half-wave rectifying unit, 630: current half-wave rectifying unit, 640: current inverting unit, 650: current adding unit, 1500: rectifying circuit, 1510: voltage-current converting unit, 1512: voltage-current converting element, 1514: current recovering circuit, 1516: current regenerating circuit, 1520: current half-wave rectifying unit, 1522: current half-wave rectifying circuit, 1524: current half-wave rectifying circuit, 1526: current adding circuit, 1530: current half-wave rectifying unit, 1532: current half-wave rectifying circuit, 1534: current half-wave rectifying circuit, 1536: current adding circuit, 1540: current inverting unit, 1550: current adding unit

What is claimed is:

1. A rectifying circuit comprising:
    a voltage-current converting circuit that converts an input voltage into a current;
    a first transistor and a second transistor that are coupled in series, wherein a first terminal of the first transistor and a first terminal of the second transistor are connected to a first node into which the current converted by the voltage-current converting circuit flows;
    a third transistor and a fourth transistor that are connected in series, that respectively mirror a current flowing through the first transistor and a current flowing through the second transistor, and that respectively have a control terminal connected to a control terminal of the first transistor, and a control terminal connected to a control terminal of the second transistor, wherein the third transistor and the fourth transistor are connected to a second node via a first terminal of the third transistor and a first terminal of the fourth transistor;
    a first diode that has a first terminal and is coupled between the second node and an output terminal, wherein the first terminal of the first diode is coupled to the second node; and
    a combining circuit that combines an output current of the first diode and an output current of a second diode;
    wherein the combining circuit includes:
    an inverting circuit that inverts the output current of the second diode; and
    an adding circuit that adds up the output current of the first diode and an output current of the inverting circuit.

2. The rectifying circuit according to claim 1, wherein the voltage-current converting circuit includes:
    a resistance element that has one end into which the input voltage is input; and
    a differential amplifier that has a first input terminal connected to the other end of the resistance element and the first node, that has a second input terminal connected to a reference voltage terminal, and that outputs a bias voltage to the control terminals of the first transistor and the second transistor.

3. The rectifying circuit according to claim 1, wherein the second diode has a cathode side coupled to the second node.

4. The rectifying circuit according to claim 1, wherein at least one of the first transistor, the second transistor, the third transistor, and the fourth transistor has a switch that is provided on at least one of a source side and a drain side.

5. The rectifying circuit according to claim 1, comprising:
    a cascode circuit that is provided in at least one of a location between the first transistor and the second transistor and a location between the third transistor and the fourth transistor.

6. The rectifying circuit according to claim 1, comprising:
    a resistance element that is provided between the first transistor and the second transistor, and the first node.

7. The rectifying circuit according to claim 1, comprising:
    a switch that is provided between the first transistor and the second transistor, and the first node.

8. The rectifying circuit according to claim 1, further comprising:
    a fifth transistor and a sixth transistor that are connected in series, and that are connected to one end of a resistance element which has the other end connected to a reference voltage terminal;
    a seventh transistor and an eighth transistor that are connected in series, and that respectively mirror a current flowing through the fifth transistor and a current flowing through the sixth transistor;
    a third diode that is coupled between a third node coupled to the seventh transistor and the eighth transistor, and the output terminal; and
    a fourth diode that has a cathode side coupled to the third node,
    wherein the voltage-current converting circuit has a first output terminal for outputting a bias voltage to the control terminals of the first transistor and the second transistor, and a second output terminal for outputting a bias voltage to control terminals of the fifth transistor and the sixth transistor,
    the inverting circuit inverts an output current of the fourth diode, and
    the adding circuit adds up output currents of the first diode and the third diode and an output current of the inverting circuit.

* * * * *